(12) United States Patent
Maher et al.

(10) Patent No.: US 8,838,193 B2
(45) Date of Patent: Sep. 16, 2014

(54) MAGNETIC MODULE

(75) Inventors: Eamonn Maher, Henley-On-Thames (GB); Ian Leitch McDougall, Oxford (GB)

(73) Assignee: 3-CS Ltd, Worcestershire (GB)

( * ) Notice: Subject to any disclaimer, the term of this patent is extended or adjusted under 35 U.S.C. 154(b) by 236 days.

(21) Appl. No.: 13/254,106

(22) PCT Filed: Mar. 5, 2010

(86) PCT No.: PCT/GB2010/000396
§ 371 (c)(1), (2), (4) Date: Nov. 29, 2011

(87) PCT Pub. No.: WO2010/100433
PCT Pub. Date: Sep. 10, 2010

(65) Prior Publication Data
US 2012/0065073 A1     Mar. 15, 2012

(30) Foreign Application Priority Data

Mar. 6, 2009   (GB) .................................. 0903942.1
Jun. 30, 2009  (GB) .................................. 0911336.6

(51) Int. Cl.
*G01R 33/035*     (2006.01)

(52) U.S. Cl.
USPC ......................................... 505/162; 505/211

(58) Field of Classification Search
USPC .................................. 505/162, 211; 335/216
See application file for complete search history.

(56) References Cited

U.S. PATENT DOCUMENTS 5,138,326 A      8/1992   Edwards et al.
2008/0004184 A1  1/2008   Ohmatsu

FOREIGN PATENT DOCUMENTS

| JP | 7142244   | 6/1995  |
| JP | 2008140905 | 6/2008  |
| JP | 2008140930 | 6/2008  |
| WO | 2008133003 | 11/2008 |

OTHER PUBLICATIONS

International Search Report for PCT/GB2010/000396 dated May 26, 2010.

*Primary Examiner* — Colleen Dunn
(74) *Attorney, Agent, or Firm* — Andrus Intellectual Property Law, LLP

(57) ABSTRACT

A magnetic field source is provided comprising a support structure upon which is positioned a conducting surface path of superconductor material. The support structure has an at least partially radially overlapping layer of material arranged in a spiral. A corresponding conducting surface path of superconductor material is arranged on the surface of the support structure such that the conducting path has a first point for the introduction of current and a second point for the extraction of current.

28 Claims, 34 Drawing Sheets

Typical Module for Adaptation of Principal direction of magnetic field in a plane.

1st substantial field source, comprising flat spiral continuous conducting surface.
300 layers; (~ 190 metres) 200 Amperes current capacity = 60,000 Ampere turns
Inner radius 8cm     Outer radius 12cm     Path width 4cm 2nd lesser field source, comprising cylindrical coated surface with a defined helical conduction path.
1 layer; 20 turns; (~ 4 metres) 200 Amperes current capacity = +/- 4000 Ampere turns
Inner radius 3cm     Outer radius 3.1cm     Path length 10cm 2nd field source axis of symmetry at 90° to 1st field source axis of symmetry
Both field source axes of symmetry in YZ plane.
Field sources have common origin Field values along co-ordinates X,Y,Z 1st field source 60,000 Ampere turns

| Ampere turns 2nd source | Field Gauss | Bx | By | Bz | re-direction |
|---|---|---|---|---|---|
| +4000 | | 0 | 3742 | 496 | 8° |
| 0 | | 0 | 3742 | 0 | 0 |
| -4000 | | 0 | 3742 | -496 | -8° |

Fig. 10

Dimensions and location of PCMM in circular array (field rotation along contour), & MRI field in plane of array
16 modules; radius a1 = 7cm, radius a2 = 7.5cm, Length = 15cm, Amp turns = 100000
| PCMM location Φ° | Grid location Contour origin cm | | | Mean contour Radius cm | Principal Fld direction ° |
|---|---|---|---|---|---|
| | 500 | 500 | 500 | | |
| | X | Y | Z | | |
| 0 | 500 | 545.0 | 500 | 45 | 0 |
| 22.5 | 500 | 541.6 | 517.2 | 45 | 45 |
| 45 | 500 | 531.8 | 531.8 | 45 | 90 |
| 67.5 | 500 | 517.2 | 541.6 | 45 | 135 |
| 90 | 500 | 500.0 | 545.0 | 45 | 180 |
| 112.5 | 500 | 482.8 | 541.6 | 45 | 225 |
| 135 | 500 | 468.2 | 531.8 | 45 | 270 |
| 157.5 | 500 | 458.4 | 517.2 | 45 | 315 |
| 180 | 500 | 455.0 | 500.0 | 45 | 360 |
| 202.5 | 500 | 458.4 | 482.8 | 45 | 405 |
| 225 | 500 | 468.2 | 468.2 | 45 | 450 |
| 247.5 | 500 | 482.8 | 458.4 | 45 | 495 |
| 270 | 500 | 500.0 | 455.0 | 45 | 540 |
| 292.5 | 500 | 517.2 | 458.4 | 45 | 585 |
| 315 | 500 | 531.8 | 468.2 | 45 | 630 |
| 337.5 | 500 | 541.6 | 482.8 | 45 | 675 |
Fig. 12a
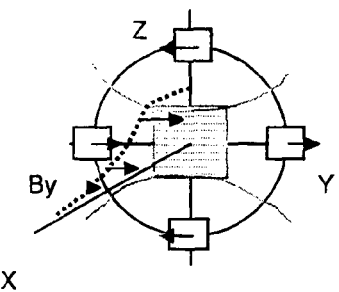
Fig. 12b
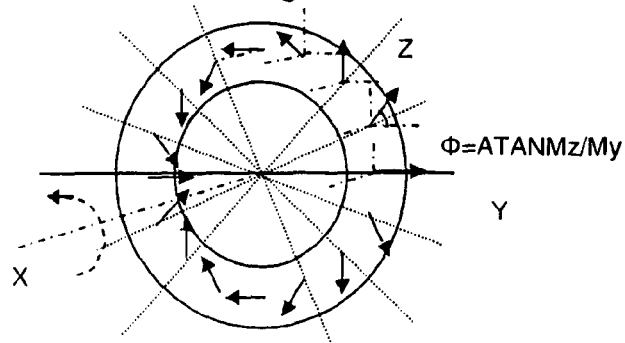
Fig 12c

Dimensions of PCMM in circular array (field rotation along contour), & MRI field in plane of array, using flat spiral race track 1st source & two coated conductor cylinders with defined helical current paths 2nd sources.

1st source 16 modules:

| PCMM location Φ° | Grid location | | | Mean contour | Principal Fld |
|---|---|---|---|---|---|
| | Contour origin | cm | Radius | cm | direction ° |
| | | 500 | 500 | 500 | |
| | X | Y | Z | | |
| 0 | 500 | 545.0 | 500 | 45 | 0 |
| 22.5 | 500 | 541.6 | 517.2 | 45 | 45 |
| 45 | 500 | 531.8 | 531.8 | 45 | 90 |
| 67.5 | 500 | 517.2 | 541.6 | 45 | 135 |
| 90 | 500 | 500.0 | 545.0 | 45 | 180 |
| 112.5 | 500 | 482.8 | 541.6 | 45 | 225 |
| 135 | 500 | 468.2 | 531.8 | 45 | 270 |
| 157.5 | 500 | 458.4 | 517.2 | 45 | 315 |
| 180 | 500 | 455.0 | 500.0 | 45 | 360 |
| 202.5 | 500 | 458.4 | 482.8 | 45 | 405 |
| 225 | 500 | 468.2 | 468.2 | 45 | 450 |
| 247.5 | 500 | 482.8 | 458.4 | 45 | 495 |
| 270 | 500 | 500.0 | 455.0 | 45 | 540 |
| 292.5 | 500 | 517.2 | 458.4 | 45 | 585 |
| 315 | 500 | 531.8 | 468.2 | 45 | 630 |
| 337.5 | 500 | 541.6 | 482.8 | 45 | 675 |

End radius a1 = 7cm, End radius a2 = 7.5cm, Length straight sides = 100cm, Build normal to plane of race track = 15cm; Amp turns = 100000

2nd source 16 modules; 32 cylinders

| PCMM location Φ° | Grid location | | | Mean contour | Principal Fld |
|---|---|---|---|---|---|
| | Contour origin | cm | Radius | cm | direction ° |
| | | 500 | 500 | 500 | |
| | X | Y | Z | | |
| 0 | 484/516 | 545.0 | 500 | 45 | 0 |
| 22.5 | 484/516 | 541.6 | 517.2 | 45 | 45 |
| 45 | 484/516 | 531.8 | 531.8 | 45 | 90 |
| 67.5 | 484/516 | 517.2 | 541.6 | 45 | 135 |
| 90 | 484/516 | 500.0 | 545.0 | 45 | 180 |
| 112.5 | 484/516 | 482.8 | 541.6 | 45 | 225 |
| 135 | 484/516 | 468.2 | 531.8 | 45 | 270 |
| 157.5 | 484/516 | 458.4 | 517.2 | 45 | 315 |
| 180 | 484/516 | 455.0 | 500.0 | 45 | 360 |
| 202.5 | 484/516 | 458.4 | 482.8 | 45 | 405 |
| 225 | 484/516 | 468.2 | 468.2 | 45 | 450 |
| 247.5 | 484/516 | 482.8 | 458.4 | 45 | 495 |
| 270 | 484/516 | 500.0 | 455.0 | 45 | 540 |
| 292.5 | 484/516 | 517.2 | 458.4 | 45 | 585 |
| 315 | 484/516 | 531.8 | 468.2 | 45 | 630 |
| 337.5 | 484/516 | 541.6 | 482.8 | 45 | 675 |

End radius a1 = 7cm, End radius a2 = 7.5cm, length cylinder = 15cm, Amp turns each cylinder = -25000

Fig. 19

PCMM modular efficiency in terms of conductor path volume for rotated field direction along array contours

Section 5.2.1 Magnet with x6 circular arrays of PCMM with transverse field direction
MRI field value = 1884 Gauss   Array radius 0.4m   Fringe field mean radius ~ 0.6m
Number of modules per array = 16
Number of arrays = 6
Cylindrical flat spiral module, $1^{st}$ source support surface per turn 0.46m
Average Ampere turns per $1^{st}$ source for each associated pair of arrays.
Inner            Middle           Outer
89000            235000           5500
Average path length 0.5cm width/$1^{st}$ source for each module of associated arrays,@ 200A
Inner            Middle           Outer
204m             540m             13m
Total path length of $1^{st}$ sources for each associated pair of arrays
Inner            Middle           Outer            Total magnet
6528m            17280m           416m             24224m
Cylindrical module, $2^{nd}$ source single support surface defined turns length = 14m
Average Ampere turns per $2^{nd}$ source for all associated pair of arrays @ 200A = 6000
Total path length of $2^{nd}$ sources for all associated pair of arrays = 1344m
Total magnet defined path single support surface = 1344m
SUM magnet path length = 25568m Section 5.2.2 Magnet with x1 circular array of race track PCMM with transverse field
MRI field value = 1926 Gauss   Array radius 0.4m   Fringe field mean radius ~ 0.6m
Number of modules per array = 16
Number of arrays = 1
Race track spiral module, $1^{st}$ source support surface per turn 2.46m
Average Ampere turns per $1^{st}$ source for array = 100000
Average path length 0.5cm width / $1^{st}$ source for each module of array,
@ 200 Amps = 1230m
Total path length of $1^{st}$ sources for array = 19680m
Total magnet = 19680m Cylindrical, $2^{nd}$ source double support surface defined turns length = 28m
Average Ampere turns per $2^{nd}$ sources for array @ 200A = 12000
Total path length of $2^{nd}$ sources for array = 448m
Total magnet defined path single support surface = 448m
SUM magnet path length = 20128m Six coil LTS solenoid field form MRI magnet, Actively shielded
MRI field value = 5102 Gauss   Coil radius 0.6 m   Fringe field mean radius ~ 1.2m
Number of coils = 8
Magnet Ampere turns = 1,938,800 @ 200Amps
Conductor length = 38200m

Fig. 22

Dimensions of PCMM in circular array (field direction constant along contour), & MRI field along axis of array rotational symmetry, using flat spiral 1$^{st}$ source & one or more coated conductor cylinders with defined helical current paths as 2$^{nd}$ sources.

Circular array PCM modules comprise Magnet (Module Direction of magnetic field // MRI field)
Dimensions relative to magnet origin in cm;
Ni uniformly distributed in cross section, shown +/- as circulation around element

|  | a1 | a2 | ½ length b1 | ½ length b2 | Amp turns (Ni) |
|---|---|---|---|---|---|
| 1$^{st}$ src, element #1 | 40.30 | 41.30 | 6.17 | 14.17 | 184800 |
| 1$^{st}$ src, element #1 | 65.00 | 67.50 | 6.17 | 14.17 | -184800 |
| 1$^{st}$ src, element #2 | 40.00 | 41.50 | 33.34 | 45.34 | 415800 |
| 1$^{st}$ src, element #2 | 54.50 | 58.30 | 33.34 | 45.34 | -415800 |
| 2$^{nd}$ src, element #1 | 40.00 | 41.00 | 15.57 | 25.57 | 50997 |
| 2$^{nd}$ src, element #1 | 55.00 | 56.00 | 22.75 | 32.75 | -50997 |

Fig. 23a

Circular array PCM modules comprise Magnet (Module Direction of magnetic field tilted w.r.t MRI field – tilted 2$^{nd}$ sources):
Dimensions relative to magnet origin in cm;
Ni uniformly distributed in cross section, shown +/- as circulation around element

|  | a1 | a2 | ½ length b1 | ½ length b2 | Amp turns (Ni) |
|---|---|---|---|---|---|
| 1$^{st}$ src, element #1 | 43.00 | 54.00 | 17.50 | 22.00 | 81792 |
| 1$^{st}$ src, element #1 | 75.00 | 86.00 | 28.00 | 32.50 | -81792 |
| 2$^{nd}$ src, element #1 | 16.5 | 16.75 | 18.00 | 18.50 | 2510 |
| 2$^{nd}$ src, element #1 | 33.00 | 33.25 | 36.00 | 36.50 | -2510 |
| 2$^{nd}$ src, element #2 | 11.00 | 11.25 | 18.00 | 18.50 | 972 |
| 2$^{nd}$ src, element #2 | 22.00 | 22.25 | 36.00 | 36.50 | -972 |
| 2$^{nd}$ src, element #3 | 6.50 | 6.75 | 18.00 | 18.50 | 278 |
| 2$^{nd}$ src, element #3 | 13.00 | 13.25 | 36.00 | 36.50 | -278 |
| 2$^{nd}$ src, element #4 | 2.80 | 3.05 | 18.00 | 18.50 | 437 |
| 2$^{nd}$ src, element #4 | 5.60 | 5.85 | 36.00 | 36.50 | -437 |

Fig 23b

5cm grid

Dimensions of PCMM MRI magnet with associated arrays in two fold axes of rotational symmetry.
Spiral PPCM: dimensions of principal circular defined current path
Inner radius of HTS support surface = inner radius defined current path = 1.5 cm
Outer radius of HTS support surface = outer radius defined current path = 3.3cm
Total width of HTS support surface = Total width of defined current path = 5cm
Number of turns of defined current path about axis of PCMM symmetric rotation = 150
Amperes transport current = 200

Associated arrays: overall dimensions of all magnetic sources comprising MRI magnet
Inner radius of close packed array = inner radius equivalent current path = 8.5 cm
Outer radius of close packed array = outer radius equivalent current path = 10 cm
Equivalent Ampere turns of close packed array = 150 x 200 = 30000

Relative location of arrays: dimensions of MRI magnet
(measured between mid plane of arrays)
Separation distance of array pairs along axis of rotational separation symmetry
$1^{st}$ pair = 60cm tilt about X axis +/- 30°    $2^{nd}$ pair = 80cm tilt about X axis +/- 30°

Distance of orthogonal arrays from point of intersection between axes of separation rotational symmetry and orthogonal rotational symmetry
$1^{st}$ array = -10cm along Z    $2^{nd}$ array = -30cm along Z Optimised Ampere turns for projecting a uniform 500 Gauss MRI region using associated PCMM arrays in two fold rotational symmetry, corrected to fourth order.
$1^{st}$ Separated pair = 60cm    = - 79542 Ampere turns
$2^{nd}$ Separated pair = 80cm    = +627948 Ampere turns
$1^{st}$ Orthogonal array = -10cm    = - 37458 Ampere turns
$2^{nd}$ Orthogonal array = -30cm    = +788361 Ampere turns Total length of spiral defined current path is 31m/PCMM x7/array pole x6arrays ~ 1300m

Fig. 28b

MAGNETIC MODULE

CROSS REFERENCE TO RELATED APPLICATION

The present application is the U.S. national stage application of International Application PCT/GB2010/000396, filed Mar. 5, 2010, which international application was published on Sep. 10, 2010, as International Publication WO 2010/100433. The International Application claims priority of British Patent Application 0903942.1, filed Mar. 6, 2009, and British Patent Application 0911336.6, filed Jun. 30, 2009.

FIELD OF THE INVENTION

The present invention relates to magnet field sources and in particular but not exclusively to magnetic modules for use in a magnetic resonance imaging magnet in which a plurality of field creating modules are used to create a uniform field in a target volume and where each module individually creates a magnetic field which can be adapted in use with respect to the magnitude and direction of the principal direction of magnetic field, and, further, the modules are particularly suited to construction using high temperature thin film superconductor.

BACKGROUND TO THE INVENTION

Commercial production of Low Temperature Superconductor composites (LTS) has hitherto enabled the fabrication of magnetic resonance imaging magnets, which provide both for high magnetic field intensity by normal engineering standards, so maximising NMR signal to noise ratio, and for significant field uniformity in a target volume suitable for MRI. The LTS conductors are available in long lengths of wire or cable. These are mechanically self supporting and ductile, such that conventional coil winding techniques are enabled for the fabrication of solenoid coils. In addition, large and complex stresses due to electro magnetic forces, as well as thermal strain are accommodated by LTS conductors. However, the need to cool such magnet windings in operation to the temperature at which Helium is a liquid at atmospheric pressure, thereby providing a refrigeration temperature of approximately 4.2° K, such that LTS materials carry substantial super currents for field creation, is a major economic and deployment constraint of MRI applications.

High temperature superconducting materials (HTS) are desirable as a replacement for LTS materials as they carry electric currents in a superconducting state at temperatures well above liquid Helium refrigeration, in some cases as high as 120° K, which brings more adaptable and rugged magnet systems. Some HTS materials may be conveniently used in the temperature range achieved by deploying nitrogen in gas or liquid form as a refrigerant or heat transfer medium, typically from 66° K upwards. However, HTS materials are constrained in use for MRI magnets by other factors relevant to engineering requirements.

The best materials in terms of carrying super currents at elevated temperatures, and in the presence of magnetic fields, with high current densities are HTS thin films. Unfortunately, complex film deposition processes, such as PVD, MOCVD or sol-gel routes, are used to make laboratory scale examples of these thin film materials, and it has proved problematic to reliably scale up thin film deposition plant for production of continuous lengths of conductor on the scale of LTS conductor without defects causing locally poor superconductivity which then limits the end-to-end current available. Defects can be fundamental in nature, e.g. crystallographic defects, or they can be introduced during the many handling operations necessary for the long lengths. Further, even if long continuous lengths of conductor could be reliably and successfully produced by scaled up film deposition, the winding geometries and assembly procedures desirable for MRI magnets, as used with LTS practice, and the stresses and strains arising in use of a large cold electro-magnets, may cause mechanical failure of ceramic HTS thin films or, at the very least, scratches.

In earlier work, for example US 2007298971 and UK Patent Application No. 0903942.1 (as set out in Appendix 1) it has been shown that HTS thin films deposited on supporting surfaces, preferably closed cylindrical or conical surface geometries, which have defined current paths lithographed on the HTS material, can be used as modular sources of magnetic field, which can then be arranged in plurality in a range of settings to combine their fields in a manner suitable for MRI. This concept provides for modular electro magnets which overcome the difficulties referred to in deploying HTS thin film conductor—known as "coated conductor" for MRI magnets. In particular, the use of supported HTS surfaces with defined continuous conducting paths employing a limited volume of thin film achieves an integrated structure well able to accommodate stresses arising in use. The conducting path stress levels are also reduced for a given MRI field in many cases as the conducting paths are relatively confined, being modular, and the total radius of the MRI magnet is not "brought to bear" on the stress raising associated with electromagnetic forces, assembly and thermal strain. The modules of limited HTS material volume lend themselves to batch production and testing prior to magnet construction, using the most satisfactory deposition methods. Further, electromagnets constructed using arrays of modular field sources, in which module fields are combined in a target region to produce a suitable field profile for MRI, provide the magnet with component redundancy, wherein failed modules may be exchanged without complete de-construction of the magnet.

In UK Patent Application No. 0903942.1 (as set out in Appendix 1) it was shown that the ability to define current paths on a support surface allowed for the creation of a magnetic field within the module, the principal direction of which can be chosen relative to the main geometric axes of the module. The principal direction of magnetic field relative to the geometric axes of the module can be assigned a dedicated relationship, fixed in operation of the module by design of the defined current paths. Modules are arrayed with their magnetic origins located on a curvilinear contour joining said origins by the shortest route, and wholly or partly enclosing the target MRI volume. A MRI magnet is achieved by, first combining the projected fields of modules arrayed along a given array contour, then, secondly, associating a number of arrays such that each array shares an axis of symmetry with neighbouring arrays, and the combined projected fields of associated arrays provide a field in the MRI target region that is more uniform than the projected field of one array alone.

Importantly in attaining uniform MRI target fields, the properties of the magnetic field profile produced by magnet modules can differ between modules along an array contour. Similarly, different types of module are employed in associated arrays. Thus it is desirable to have the freedom to construct and shape the HTS coated surface and the continuous current paths lithographed on the surface with the degree of freedom inherent in the use of modular HTS batch produced sources of magnetic field. Examples are contained in UK Patent Application No. 0903942.1 (as set out in Appendix 1) of preferable relationships between defined continuous current paths on the support surfaces of modules, and assemblies of associated arrays suitable for producing a target MRI field, acting together as a MRI magnet.

Individual magnetic modules may be supplied with electric current individually or in groups using one or more associated power supplies which provide power either by conductive or inductive coupling to the defined continuous current paths. Modules may be connected in series to a power supply, or more than one power supply may be provided to generate a predetermined magnetic field in each module, or groups of said modules within an array, so as to control the size of the target MRI field volume.

The concept described in UK Patent Application No. 0903942.1 (as set out in Appendix 1) for the achieving of MRI quality field using discrete volumes of HTS material, arranged as modules comprising coated support surfaces that provide for defined current paths, overcomes the problem of enabling a precision field magnet suitable for MRI using available HTS thin film production methods. The use of coated support surfaces, generally of a curvilinear form, but typically represented by cylindrical or conical support surface geometries, suffers from the difficulty of providing a large number of field creating Ampere-turns in the limited thickness of one coated layer. In UK Patent Application No. 0903942.1 the use of ferromagnetic material in part of the volume of a module to augment the field of the defined current path was proposed. This method makes efficient use of HTS thin film material, but suffers from the disadvantage that the magnetic moment of the module becomes a non-linear function of current in the defined current path, complicating the control required to project a uniform field. Typically, a sufficient number of Ampere-turns are used to saturate the ferromagnetic material, with an excess of Ampere-turns to provide field control over and above the field created by the "constant" saturation magnetisation of the ferromagnetic material.

UK Patent Application No. 0903942.1 (as set out in Appendix 1) also describes the concept of "a plurality of magnet modules generating a magnetic field, wherein the associated magnetic fields of the modules combine at a target volume to create a field of uniformity sufficient for MRI, relying on each module comprising a support surface for a layer of superconductor through which an electric current is caused to flow in defined current paths".

It has also been proposed that multiple layers of HTS thin film material may be deposited, interleaved with electrical insulating oxide materials, such that multiple defined current paths could be provided in one field creating module, which would overcome this problem, as disclosed in, for example, US Patent Publication No. 2007298971. However, this approach requires the addition to the deposition process of several sequential depositions of different materials and the establishing of local interconnects between layers in a fashion analogous to semiconductor device manufacture, or indeed multilayer printed circuit boards.

SUMMARY OF THE INVENTION

In a first aspect the present invention provides a magnetic field source comprising a support structure upon which is positioned a conducting surface path of superconductor material said support structure having an at least partially radially overlapping layer of material arranged in a spiral; and a corresponding conducting surface path of superconductor material is arranged on the surface of the support structure such that the conducting path has a first point for the introduction of current and a second point for the extraction of current.

An advantageous approach is, therefore, provided according to the first aspect of the present invention in which essentially "concentric" support surfaces are provided as one continuous support surface in the general form of a spiral nested in a concentric manner, preferably coated with a single HTS thin film layer with lithographed defined current paths. Conventional conductor can be paths on the support surface, such that the number of Ampere-turns of a field creating module are increased in proportion to the number of concentric layers. This has two advantages over separate concentrically nested support surfaces. The first advantage is that the number of non-superconducting connections between concentrically supported coated layers is reduced for a given total number of Ampere-turns, so allowing the defined current path to act as a continuous current path in a superconducting material, thereby avoiding heat production within a module. The second advantage of using a general spiral form of the defined current path, such that the defined current path is now continuous and in the general spiral geometry, which replicates multiple concentric surfaces, is that the number of Ampere-turns is greatly increased in a compact arrangement, thus facilitating manufacture and decreasing the cost of field sources.

In a second aspect the present invention provides a magnetic field module for use as a module in a magnetic resonance system comprising a modular array arranged such that a combined field suitable for MRI measurement is created in a working region comprising a primary magnetic field source and a secondary magnetic field source each comprising a support structure upon which is defined a conducting surface path of superconductor material; wherein said primary and secondary sources are adapted such that the respective conducting surface paths are operable to be independently energised with electric current to provide a primary and a secondary magnetic field respectively; and the primary and secondary magnetic field sources are arranged such that the primary magnetic field provided by the primary source can be adapted by adjusting the secondary magnetic field provided by independently energising the secondary source.

The two magnetic field sources are arranged and energised with the resultant magnetic field being determined by the Principle of Superposition.

Therefore, an improvement in the performance of magnet modules intended for MRI magnet arrays is provided by combining in each module a primary substantial field source based on limited lengths of continuous coated conductor in radial multi-turn geometry, with a secondary lesser field source using defined current paths on a coated, closed surface. The secondary source adapts the field of the primary source so that, when combined, a plurality of such module primary sources in arrays provides improved array MRI field uniformity.

The secondary field source allows for the alteration of the principal direction of magnetic field of each PCMM relative to the geometry of the PCMM, by variation of applied currents. This is an advantage in a MRI magnet formed from arrays of PCMM in that the MRI field can be adapted in use, for example to change the MRI field profile against experimental needs or to compensate for changes in magnetic environment caused such as by introducing patients or their support equipment. Importantly, the secondary field source is close to the origin of the primary field source. In operation, this means that projected fields are corrected ("at source") without introduction of higher order field derivatives, (field perturbations) which might give rise to additional distortions of the MRI field. In essence, the use of duel field sources in PCMM means a MRI magnetic can be adapted in respect of the MRI field without adding additional undesirable distortions of the MRI field, as opposed to current practice using LTS magnets whereby primary field errors are shimmed to a limited degree by shims close to the MRI region, which usually cause high order field perturbations when correcting low order primary field errors.

One further advantage of modules in a preferred embodiment is that sealed units of factory tested capability can be manufactured wherein handling uncertainties of the preferred delicate HTS conductor are avoided during magnet assembly. Note, LTS Niobium tin conductors, with similar mechanical properties to HTS thin films, are shipped to magnet manufactures as component composites, wound, and then reacted by the magnet manufacturer to form the LTS material in-situ in the magnet, thus avoid handling uncertainties. HTS thin films cannot be organised in this way because of complicated phase chemistry. The modular aspect of the field delivery means that limited volumes of HTS can be accommodated using existing and foreseeable thin film deposition methods constrained to deliver high quality material on a batch production basis. A further point of note concerning modularity of field sources involves magnet arrays that make possible LTS niobium tin whole body MRI magnets that could deliver higher magnetic fields than generally available with current LTS engineering, depending on the concept of reaction of composite conductor in discrete-units.

In a third aspect the present invention provides a magnetic resonance system comprising a plurality of magnetic modules according to the second aspect of the present invention arranged in an array such that the magnetic fields of the magnetic modules combine within a working volume to define a field having a magnetic field direction defining a main field axis and being of sufficient uniformity to enable a magnetic resonance procedure to be performed on a target object when placed within the working volume.

A preferred method to assemble modules is via a low resistance network of bus bars. Such a system would be cryo-resistive, as distinct from having persistent mode operation. However, because the HTS conductor operates under a regime of intermediate cryogenic temperatures, the bus bar network, including interconnects, would be a few ohms in resistance, enabling the use of power supplies delivering intermediate currents at low voltage and with high stability. The array of modules behaves as a cold electromagnet. The dimensions of the current path remain constant in use because the magnet operates using super-currents in the major part of the defined current paths, under controlled refrigeration to provide a constant temperature. This has the advantage over conventional electromagnets that the field profile of the combine field of modules remains constant over time during operation. There is no drift with time in field uniformity in the MRI region.

The MRI magnetic field would be switchable, an advantage in some MRI deployments, like inter-operative scanning, Proton/electron resonance imaging, or quadrupole resonance, but still able to produce high fields, in the same range as LTS MRI magnets. Cryo-resistive magnets have not been possible in the past using modular low temperature superconductors because the resistive bus bar interconnects would generate too much heat at the low operating temperatures causing instability in the superconductor and un-economical refrigeration costs.

In a fourth aspect the present invention provides a method of manufacturing a magnetic field source according to the first aspect of the present invention comprising depositing a thin film of high temperature superconductor material onto a precursor; bonding said precursor to a support structure via an intermediate bonding surface; and wherein the precursor, intermediate bonding surface and the support structure are bonded together progressively to form a composite structure which is subsequently rolled into a spiral form.

In a fifth aspect the present invention provides a method of manufacturing a magnetic field source according to the first aspect of the present invention comprising depositing a thin film of superconductor material onto a closed support surface; cutting a helical path having an axis of rotation of a defined width in the closed support surface; applying a torsional force perpendicular to the axis of rotational symmetry; whilst compressing the support surface along the axis of rotational symmetry to form the desired shape.

BRIEF DESCRIPTION OF THE DRAWINGS

Embodiments of the present invention will now be described with reference to the drawings in which:

FIG. 10 is a table of dimensions for a primary substantial source comprising a continuous current path in the form of a flat spiral, and a secondary lesser source comprising a coated surface in the form of a cylinder, where in the YZ plane, the axis of rotational symmetry of the secondary source is at 90 degrees to that of the primary source;

FIG. 12A shows an example of modular circular array using rotation of the principal direction of magnetic field along the array contour to produce a transverse MRI field in the plane of the array: cylindrical PCMM;

FIG. 12B shows a diagram of transverse field and principal direction of field in modules;

FIG. 12C is a diagram of module rotation of principal direction of magnetic field for a transverse MRI field;

FIG. 19 shows the dimensions of a PCMM in a single circular array with field rotation along the contour of the array, where the primary field source of each module comprises a continuous conducting path of a race track profile, with two secondary field sources on the long axis of the primary source;

FIG. 22 is a table and corresponding drawing showing PCMM modular magnet efficiency in terms of conductor path volume for rotated field direction along array contour;

FIG. 23A lists the dimensions of PCMM in circular arrays for "solenoid" MRI fields: Module field direction parallel with MRI field direction;

FIG. 23B lists the dimensions of PCMM in circular arrays for "solenoid" MRI fields: Module field direction tilted with respect to MRI field direction;

FIG. 28B tabulates the dimensions of two fold symmetry shown diagrammatically in FIG. 28A;

DESCRIPTION OF PREFERRED EMBODIMENTS

The area of High Temperature Superconductor Thin Film (HTS TF) that can be deposited on a continuous surface in one run by present technology is about 1 $m^2$; equivalent to a conductor ½ cm in width and 200 m in length, carrying some 200 A. A conventional Low Temperature Superconductor (LTS) MRI magnet requires as much as 30 km of conductor. The critical current of the deposited superconducting film typically reduces as the continuous area of HTS TF deposited increases. This is generally due to drift in deposition conditions which need to be maintained to demanding limits for good superconducting properties.

It has been recognised by the inventors that it is advantageous to deposit limited thin film areas of optimised HTS TF on closed curve surfaces and subsequently define current paths by lithography. Clearly there is a practical minimum HTS TF area that needs to be deposited in one run to avoid needing excessive numbers of interconnects between field current defined paths. In particular it is preferable if approximately 1 $m^2$ as a minimum area can be deposited of good quality HTS TF, reproducibly as the unit batch size, which makes a production process for multiple magnets for arrays viable.

One advantage of this concept is that multiple HTS TF layers can in principle be laid down, with intermediate buffer layers, on separate runs, so creating a batch process analogous to semi-conductor processing. Multiple layers of HTS TF will allow for extended field current paths so creating strong magnets. A further advantage is the integral nature of the HTS TF bond which is made to a structurally ideal support medium so that forces arising in magnets can be safely carried and localised failure strains avoided. Handling risks to the HTS TF are also minimised. Magnetic modules can be manufactured as sealed units on an assembly line under quality controlled conditions, and arrays of magnetic modules can be built as structural components of MRI magnets.

The construction of what is a general spiral support surface for a continuous current path formed in a HTS thin film layer can be done in several ways, the choice of which depends in part on the deposition method use to deposit thin film layers of a particular material. These include:

i) Deposition of single HTS TF layer on buffered intermediate surface mechanically sufficient for "in process" handling only, where the intermediate surface is a linear defined conducting path. The intermediate surface; such as NiFe foil, is bonded to a support surface which may be a cylinder (subsequently nested) or a clock spring form of helix where turns overlap with respect to the radius; and ii) Multiple deposition of HTS TF with intervening buffer layers on one support surface to form a "sandwich" of HTS/buffer layers repeated many times in a radial direction. This process gives the greatest engineering current density, but requires very stringent control of deposition conditions.

Figure 1A:
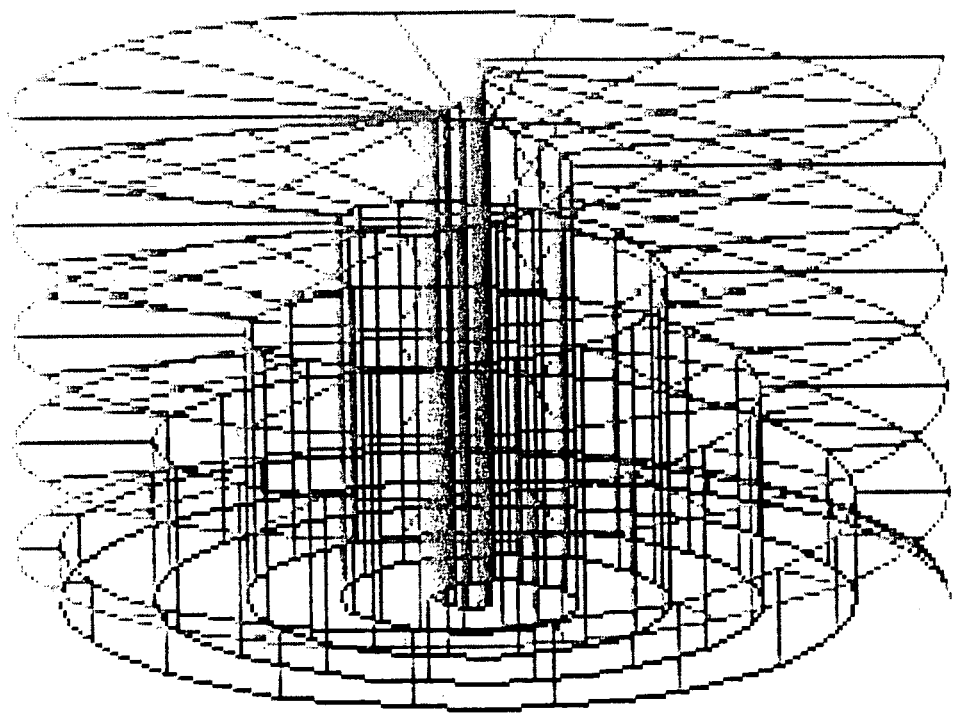
FIG. 1A shows a wire line representation of definitive forms of spiral paths, basically representing the form of current path adopted for field creating sources; shown are, a flat spiral, a conic spiral, and a helical spiral.

FIG. 1A illustrates the conducting paths of, a flat spiral, a conic spiral, and a helix. For example, it is possible to coat a closed support surface, such as a cylinder or right circular cone truncated along its axis of rotational symmetry, with a HTS thin film, and to slit, say by laser, a helical path of a defined width. The helical path is transformed mechanically into a flat spiral with radial overlapping turns by first applying a torsion force along the axis of rotation of the helix at one end of the helix, such that the helical path follows the surface of a conical spiral, having reduced the original radius along the length of the helix as a function of the length of the helix. Then, secondly, the conical spiral is compressed along its axis of rotational symmetry, such that turns lie inside each other, which, for partial compression achieves the formation of a conical spiral continuous current path with a short axis of rotational symmetry. Reduction of the length of the axis of rotational symmetry to equal the width of the slit continuous current path achieves a flat spiral continuous current path. If the initial closed support surface is a truncated cone, the compression of the helical current path to form a flat spiral is more easily achieved.

The originating closed support surface could be coated uniformly with HTS TF or alternatively the surface could be suitably patterned by, for example, lithography to further enhance the number of turns per volume and/or to control the resulting magnetic field produced by the module when in use by customising the current path defined on the surface.

Figure 1B:
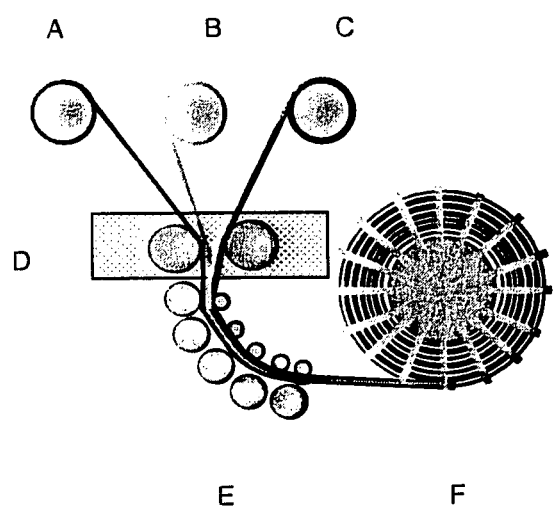
FIG. 1B shows a schematic of assembly sequence for primary field creating source, utilizing a joining of a conducting layer on intermediate support by a bonding strip to a continuous support surface A is the precursor; B is the intermediate bonding surface; C is the support surface; D is the continuous joining apparatus; E is the roll forming of the spiral; F is the continuous spiral.

Alternatively, HTS thin film layers may be deposited on a precursor support surface, being adequate only to support the HTS coating formed during deposition, and not for support during assembly of the field source or for operation of the modular field source. Such a precursor surface has mechanical and chemical properties compatible both with the material layers needed for the conducting thin film coating, and those of the support surface, which latter is used to support the continuous current path in final spiral form required for the modular field source. An intermediate support surface carrying bonding agents is used to join the precursor surface and final support surface to form a composite structure during assembly of the spiral continuous current path of the modular field source to produce optimised mechanical and electrical properties. This is achieved by bonding the precursor, intermediate and final support surfaces progressively together, starting from one end of the continuous current spiral path, and continuing to the other end of the path. Preferably, the intermediate surface carries a suitable polymer bonding agent on its surfaces, and in addition is a good electrical conductor, such as an alloy of copper, in order to offer electrical protection of the magnet. The support surface can be a non magnetic alloy of iron, or, to augment the magnetic flux created by the Ampere-turns, the support may be a ferromagnetic alloy of iron or nickel. Arrangements for assembly of a spiral continuous conducting path are shown schematically in FIG. 1B (where A is the precursor; B is the intermediate bonding surface; C is the support surface; D is the continuous joining apparatus; E is the roll forming of the spiral; and F is the continuous spiral path of at least one element of the PCMM primary field source).

The core of a PCMM is the structural support surface which is bonded to a layer of HTS TF to provide mechanical, electrical, magnetic, and thermal properties appropriate for the operation of the defined field current paths. The support surface can be regarded as a manifold which defines the overall shape of the PCMM and the general profile of the magnetic field. Whereas the defined field current paths can be regarded as simplified sub areas or regions whose boundaries are set by the manifold, and which provided precisely definable components of a magnetic vector field of the PCMM.

The support surface itself comprises a substrate material that offers mechanical support to the HTS thin film against electromagnetic forces arising when magnetic field is created. The cross section of the support material is of rectangular geometry with the conducting surface on one, or both, longer sides of the section. The dimensions of the smaller sides of cross section are such that the second moment of the cross sectional area of the support substrate offers a significant resistance to deformation by bending or twisting due to forces applied either perpendicular or parallel to the plane of the conducting surface. This support is for the purpose of physical stabilisation of a multi-turn spiral field creating source, which is defined by the source conducting path generally behaving during handling as a traditional spiral clock spring with a natural curve which varies with radius and extension along the rotational axis of symmetry of a cone. The support material may be metallic or ceramic in nature, where the thermo-mechanical properties are chosen to be compatible with the same class of properties for the HTS thin film. In cases where the HTS thin film is to be deposited to form an integral component with the support material, the support material is chemically compatible with buffer layers needed to create an accommodation interface for the superconductor. An example of this would be a metallic alloy of Nickel, known as Hastelloy. Metallic substrate materials are required for assembling spiral continuous current paths by slitting conical coated surfaces to form helical current paths, subsequently compressed axially to form the spiral.

Useful Properties of a Support Surface for HTS TF Coating, Applied by Direct Deposition on Buffer Layers.

(i) Mechanical: The purpose of the support surface is to keep strains arising in the HTS TF below limits defined as critical to the integrity of the superconducting condition under all forces arising in the PCMM when operating in its designed magnetic field. A defined conducting path in the thin film layer has a transverse cross section with one small dimension being thickness and a relatively much greater dimension being the width of the conducting path. As such the thin film layer has a small second moment of inertia and, therefore, an impractical resistance to bending or deflection under electromagnetic forces. This will also be true if intermediate support surfaces such as NiFe foil are used. Thus the support surface of a PCMM will be arranged to have a second moment of inertia adequate to resist deflections leading beyond the critical strain of the HTS TF. In general, this will be achieved with a rectangular cross section of support surface and the use of a material with a high elastic modulus, but more complex cross sections such as I-beams could be employed, formed by, say, rolling a strip of material into the I-beam cross section prior to coating or bonding with HTS TF. Local stiffening webs may be attached to the support surface, passing, for example, in a radial sense between several overlapping turns of spiral with the general objective of increasing the stiffness of the PCMM manifold.

As described above, there are several ways to combine the HTS TF and the support surface, such as co-winding a spiral of support and intermediate coated conductor, or coating and helically slitting a cylinder, followed by axial compression plus start and end rotation to form a helix. The choice of material for the support surface will include consideration of the relative coefficient of expansion of the support and HTS TF. This is particularly important as it is preferable to operate the PCMM with slight compression of the HTS TF achieved by appropriate relative thermal contraction as the PCMM is cooled to operating temperature. By compressing the HTS TF, localised strains or microscopic defects are less likely to nucleate micro cracks.

(ii) Electrical: The support surface may have a good normal conductor, such as copper or gold, as part of the transverse cross section. This is to provide a normal shunt path in parallel with the HTS TF coating to protect the PCMM from burn out in the event that superconductivity is lost while the MRI magnet is at operating field. It will probably be the case that a support surface with a sandwich type of material cross section will be required, for example a stainless steel with high elastic modulus provides mechanical performance and a copper strip next to the HTS TF buffer layers provides the shunt. The use of such "massive" shunts in the support material does not preclude provision of intermingled shunts form by gold layers vacuum sputtered onto the "top" surface of the HTS TF. Such layers are in better electric and thermal contact with the HTS TF than the mechanical support with intervening buffer layers. In the co-winding approach to forming a support surface, copper strip can be co-wound onto the upper surface of a gold coated HTS TF as the intermediate support is wound onto the spiral support surface. Electric shunts can also provide thermal ground layers.

(iii) Magnetic: Because the objective of using PCMM for array type MRI magnets crucially involves minimising the area of HTS TF needed for a given field intensity, it is desirable to include in the structure of the PCMM a material that will be magnetised by the defined field current paths. For efficient use of the volume occupied by PCMM (both electromagnetic and thermal) it is an advantage to use magnetic material in the support structure. One simple example would be to use transformer steel as the support surface, since this has both a high elastic modulus and a high magnetic permeability. Ferromagnetic augmentation is not usual in LTS magnets because of its non linear magnetic properties at low temperature, although it is widely used at room temperature as a magnetic shim system.

(iv) Thermal: The composition and detailed structure of the support surface can be adapted to aid heat exchange between the HTS TF layer and the heat exchange medium employed in the refrigeration circuit. As explained in (ii) above, the inclusion of good normal electrical conductor for shunt purposes can also aid the conduction of heat, both along the support path in the direction of the defined field current path, and transverse to the defined field current path. In the former instance the temperature of the HTS TF along the field conduction path is evened out, while in the latter, heat extraction from the PCMM by the refrigeration is improved.

However, in addition, the support surface may be arranged to allow heat exchange media to flow through a finely divided matrix of conduits formed by spacing apart layers of the support structure. For example, there could be radial gaps between nested cylinders, or between radial overlapping turns of a spiral. Preferably the spiral support surfaces are not closely packed in respect to radial dimension and thus when the support surface is arranged as a spiral with partly overlapping turns it has a radial spacing between the support surface turns. This further allows for electrical connections and cooling improvements. The organisation of the refrigeration system could be such as to cause forced flow of heat exchange material through the conduits to improve temperature control, and reduce the time needed to adjust the magnet temperature. Such heat exchange matrices allow for PCMM to be inserted in refrigeration circuits to obtain particular specified thermal performance from the system. An important aspect of this is that refrigeration economies could be obtained by using lower operating temperatures in those sections of arrays with the greatest contribution to the MRI field: i.e. where highest critical current is needed in the HTS TF. Similarly, a conduit form of heat exchanger allows for the cold volume of the system to be minimised, so achieving the most compact superconducting magnet structure.

Such an arrangement does not significantly reduce the dipole moment of projected field as integration of field H is around the outside of the ampere turns where the interest is in projected field intensity. The spacing range should be between 1/10th and three times the thickness of the support surface. The spacing may be achieved by self supporting capability of a rigid support surface, or by embossed features on one side of the support surface allowing spacing of a tight spiral with line tension, or by radial stays carrying spacing inserts across the face of the support surface parallel with the axis of spiral rotation.

Thus, the utilisation of a continuous spiral support surface upon which the superconducting material is arranged permits enhanced functional properties that are important to magnet performance not found in HTS TF on, for example, buffered substrates designed only for handling of the conductor during deposition.

If the support surface is expanded with respect to radius, say to leave gaps for conduits, the engineering current density $J_e$ of the PCMM will be reduced. The magnetic field at the origin and the projected vector field will be reduced. However, as arrays use the projected field at distances typically several PCMM diameters, the dipole moment of the PCMM is the parameter of main influence on projected field values, and this is not sensitive to $J_e$.

PCMM with Spiral Defined Conducting Paths

In addition, flat surfaces of HTS TF may be assembled into spiral defined conducting paths suitable PCMM construction. The advantage of this assembly means is that PCMM with a large number of Ampere turns can be achieved, where by the use of lithography on each individual HTS TF coated support surface allows a plurality of individual defined current paths to be used in one PCMM. This makes possible near continuous variation in the current density in the PCMM, allowing for detailed control of the projected field profile of the PCMM. A specific example of this benefit would be the correction of end effects within the plane sections of race track spiral defined current paths along sections of the axis of rotational symmetry of a race track profile PCMM. Alternatively, a radial variation in current density can be achieved where concentric support surfaces are used rolled up from flat, which optimise the PCMM current density against the critical current density of the HTS TF, rather in the manner of grading winding densities in superconducting LTS solenoids.

Figure 1C:
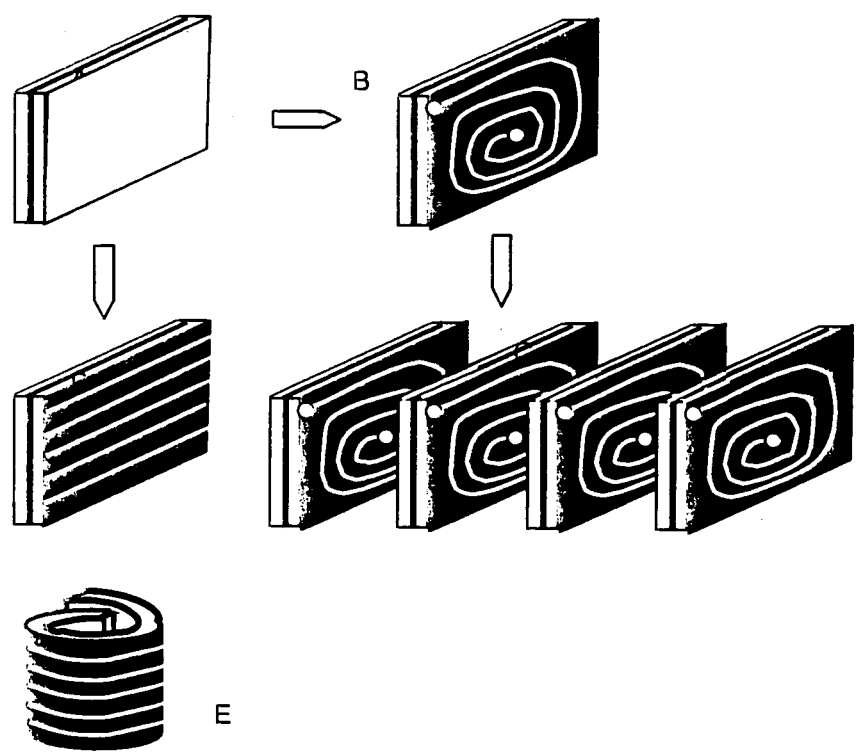
FIG. 1C shows Means of assembling PCMM defined current paths to achieve a large number of ampere turns, utilizing a monolithic flat support surface. A=flat support surface comprising materials offering mechanical, electrical, magnetic and thermal properties. B=lithographed defined current path, characteristic of the specified location along PCMM longitudinal axis. C=plurality of flat spiral race track defined current paths, optionally cut through into the support surface, forming the PCMM field source. D=parallel defined current paths on coated flat support surface. E=parallel defined current paths rolled into an Archimedean spiral set of parallel defined current paths.

An example of converting a flat HTS TF coating into a spiral defined current path is given in FIG. 1c, using either a direct coating of a support surface or an indirect coating employing a precursor substrate bonded to the final support surface. FIG. 1c illustrates a support surface designed to offer mechanical, electrical shunt, magnetic and cooling characteristics to the superconducting HTS TF coating. The geometry of this surface is initially a flat rectangle. The aspect ration of the rectangle may be in the range from 1:1 to 100:1, but importantly, the minimum absolute dimension of one side of the rectangle should be similar to either the diameter or length of the PCMM for which the support surface is intended. The support surface may be directly coated or it may have a precursor intermediate coated surface bonded to it. As illustrated in FIG. 1c, the spiral defined conducting path may be created by lithography of the HTS TF coating, in which case the spiral may be of any standard geometry. Of particular use is the geometry of a race track spiral, FIG. 1C item B, in which the current path executes two straight sides, where this provides a natural symmetry for a uniform field profile in the direction parallel to the straight side of the current path. A plurality of flat spiral current paths of support surfaces may be stacked along a common axis of rotational symmetry to form the PCMM, FIG. 1C item C.

Alternatively, the HTS TF coating may be lithographed to form parallel defined current paths either parallel or at a small angle to one side of the support surface, FIG. 1C item D. As illustrated in FIG. 1C, the support surface and the parallel conducting paths may be rolled about an axis parallel, or near parallel, to the straight side opposite the side used to define the parallel conduction paths, FIG. 1C item E. In this way, a set of adjacent flat spiral conducting paths about an axis of rotational symmetry is achieved, where advantageously, after fitting appropriate electrical interconnects, a complete PCMM can be obtained from one forming operation applied to the support surface.

It should be noted that the HTS TF coating only may be cut through, or part or all of the support surface may be also be cut through by lithography using such means as laser lithography. The thickness of the cut path in the HTS TF coating can be adjusted to achieve a desired radial spacing of radial overlapping defined current paths on flat support surfaces, FIG. 1C item B.

Improvement in Ampere-Turns Utilising PCMM

By utilising a PCMM, having either a spiral support surface as described in the above embodiment or a closed surface such as a cylinder, it is possible to maximise the number of Ampere-turns comprising defined current paths on HTS surface layers formed on a support surface. A modular field source achieved with the increased Ampere-turns is referred to later in this application as a primary substantial magnetic field creating source, consisting of continuous current conducting surface paths that create the magnetic field. To appreciate the scale of the increase in Ampere-turns compared to, the following example can be considered.

A single HTS thin film coated cylinder, Radius 7 cm Length 10 cm, has 20 turns of defined current path lithographed on the coating, path width being ½ cm. Typically, in a 500 nano-meter thick layer, the critical current of the path is 200 Amperes. Thus one cylinder has 4000 Ampere-turns (200×20), creating a magnetic flux at the origin of the cylinder of 343 Gauss.

If a ferromagnetic material such as Silicon Iron is exposed to the 4000 Ampere-turns, the material polarisation increases the flux at the origin of the coated cylinder to ~20,000 Gauss. This is equivalent to 233,100 Ampere-turns.

Alternatively, if 10 concentric coated cylinders are assembled, with a minimum radius of 6.5 cm, maximum radius 7.5 cm and Length 10 cm with ½ cm path width, the 40,000 Ampere-turns (200×20×10) create some 2876 Gauss at the origin.

Further, alternatively, if a HTS coating is applied to a ½ cm wide precursor foil support surface, in a convenient length of 20 meters, and subsequently mounted on a 0.7 mm thick spiral support surface, the continuous field creating current path has the dimensions of maximum radius 7 cm, minimum radius 2.5 cm with 67 turns Length 0.5 cm, with it being possible to accommodate 20 such spirals along a 10 cm co-axial length, the 268,000 Ampere-turns (200×67×20) create some 23931 Gauss at the origin.

Improvement in MRI Magnet Build Errors

Because PCMM MRI magnets are not composed of large unitary coils, substantially in dimension terms larger than the MRI region, it is possible to assemble a MRI magnet with small errors in magnetic field for the amount of conductor deployed. Conventional unitary LTS coils are designed typically to $1/10^{th}$ of a mm in precision, but can practically only be wound to a dimensional accuracy of 1 to 5 mm. The error in magnetic field this tolerance causes is unacceptable for MRI and is reduced by applying independent field sources close to the MRI region, which may be either current or magnetic in type. PCMM defined current paths can be constructed to fine tolerances, ranging from 0.001 mm for lithographic preparation to laboratory scale bonding of precursor coatings of 0.01 mm. Subsequent assembly of arrays of PCMM each some 10 to 20 cm in diameter can be achieved using crate like frames CNC machined such that dimensions critical to the accuracy of magnetic field can be achieved to a tolerance of 0.1 mm. As mentioned in connection with the purpose of secondary defined current paths in each PCMM, small assembly errors as they cause un-wanted perturbations in magnetic field can be corrected at source; i.e. in the PCMM.

It should be noted that because the PCMM MRI magnet operates at a controlled temperature with superconducting defined current paths, there is no heat created by the main field source, unlike a conventional resistive magnet. A small amount of heat is generated by normal conducting electrical interconnects. Thus, a PCMM arrayed MRI magnet will not materially alter its dimensions during operation by thermal expansion, and thereby avoids the deleterious change in MRI field profile which is a common problem with conventional resistive MRI magnets. Therefore, it is advantageous to assembly the PCMM arrays to a high tolerance, and rely on secondary field sources to correct mainly environmental disturbances of magnetic field.

Improved Module Performance with Multiple HTS Surface Layers for Coarse Field Creation and a Second Independent HTS Surface Layer for Fine Adaptation of the Combined Field In previous work concerning the combining of projected magnetic fields from an array of modules (e.g. UK Patent Application No. 0903942.1 as set out in Appendix 1), the benefits where illustrated of the freedom to choose defined current paths that provided particular orientation of the principal direction of magnetic field of a module relative to the physical dimensions of the module, when the projected fields of more than one module were combined in a target MRI region. The concept of this present invention is to use generally spiral continuous surfaces to provide for a substantial Ampere-turns density in each module. However, the spiral geometry of the field creating continuous path defines the principal direction of magnetic field of the module relative to the geometry of the module, typically this being a set of flat spirals on a co-axial axis. In the case of identical spirals, the principal direction of the magnetic field would be parallel to the co-axial axis, through the geometric origin of the set of spiral continuous paths.

Given this situation, it is desirable to provide each module with at least one secondary lesser field source capable of adapting the field profile of the generally spiral current path of the primary source. Thus, when considering assembled arrays of modules in order that they combine their projected fields to provide a uniform field in a target MRI volume, the combined primary and secondary field of each module can be adjusted exactly to what is required of the module in a given location in a curvilinear array format. Further, the principal direction of magnetic field of each module can be adapted in use if the secondary field source has an independent power supply.

Preferably, the secondary field source provides a lesser field to that of the primary field source, the latter based on a continuous conducting spiral current path, and the secondary field source comprising a continuous conducting HTS layer on a support surface, enabling a wide choice of defined current paths to be rendered by lithographic processes. This provides the flexibility at the design stage of a module to choose the direction of the principal direction of magnetic field relative to the geometry of the secondary field source, and therefore, the geometry of the total module. In circumstances in which the secondary lesser field source is required to have an appreciable number of Ampere-turns, or several different patterns of defined current paths are required to affect significant changes in the principal direction of magnetic field of the module, the secondary field source comprises more than one continuous conducting surface of curvilinear form. The initial surface is enclosed concentrically by additional surfaces, particularly where defined current paths require duplication. Alternatively, closed conducting layers on more than one support surfaces, such as having cylindrical geometry, may be arranged using similar or identical defined current paths, where the support surfaces are themselves oriented in respect to one another so that when individually energised, they provide significantly different adaptive principal directions of magnetic field in the module.

The support substrate in generally cylindrical geometry can be an integral part of the conducting surface, wherein the conducting material is applied to a support surface offering resistance in use to bending forces applied along a principal axis of symmetry during the preparation of a curvilinear conducting composite by deposition by vapour transfer methods of the conducting material to the support surface. Alternatively, precursor the conducting composite may be glued to the curvilinear support surface during assembly of the secondary field source.

The support surface has similar characteristics to that described for the support of continuous spiral conducting paths utilized for the construction of the primary magnetic field source. In particular, the closed curvilinear support surfaces, preferred examples being cylinders or cones, are considered for design purposes to behave mechanically as elastic tubes, wherein the conducting surface is formed on a supporting substrate that offers mechanical support against electromagnetic forces when magnetic field is created, both by the primary and secondary field sources. The support "tubes" have a wall thickness of sufficient dimension in relation to the radius of curvature of the surface such that the second moment of the cross sectional area of the support substrate about the axis of rotational symmetry offers a significant resistance to bending by forces applied along the axis of rotational symmetry or along axes in the plane normal to the axis of rotational symmetry. This is for the purpose of stabilisation of the defined current paths creating the lesser field of the module, which is defined by the second source generally behaving during handling as an end stabilized cylinder or cone. The support "tubes" are metallic or ceramics, with functional properties outlined above.

Alternatively, as described above, HTS thin film layers may be deposited on a precursor support surface, being adequate only to support the HTS coating formed during deposition of the HTS material and surface accommodation buffer layers, and not for support during assembly of the field source or for operation of the modular field source. In this case the precursor surface would generally have the geometry of a thin sheet, with two sides of similar dimension, suitable for forming around the cylindrical support surface of the secondary field source. Such a precursor surface has mechanical and chemical properties compatible both with the material layers needed for the conducting thin film coating, and those of the support surface. The precursor and final support surfaces are joined during assembly of the generally cylindrical support surface, by bonding progressively together, starting from one end of the continuous current spiral path, and continuing to the other end of the path. The support surface if metallic, with generally cylindrical geometry itself can be fabricated by such means as billet drilling, deep drawing, casting, or sheet rolling, wherein the sheet is formed into a closed surface by seam welding. If the support surface is a ceramic, this will be formed by casting and firing using known methods.

Improved Module Performance with Multiple HTS Surface Layers for Coarse Field Creation and a Second Independent HTS Surface Layer for Fine Adaptation of the Combined Field-System Controlled by Cryo-Resistive Network In UK Patent Application No. 0903942.1 (set out in Appendix 1) the creation of uniform MRI fields in a target region enclosed by an array of HTS field creating modules is described, with particular reference to the fields projected by the modules into the target region depending on the field profiles in the modules in their relative orientations to the direction of the MRI field. An important example of an array of modules placed along a circular contour which passes through the magnetic origin of each of the modules is known as the Halbach ring. In this type of array, for a central uniform field, the principal direction of the magnetic field along the array contour rotates by an angle that is twice the angle subtended by the origin of the module at the centre of the circular array. In this patent application, examples are given of field creating modules with finite dimensions, assembled in circular co-axial arrays to produce a uniform field in the target MRI region, employing a nominal "x2" rotation of the principal direction of magnetic field around the array contour, such that the principal direction of magnetic field of each module in a given circular array is rotated relative to its nearest neighbours.

By constructing each field creating module with a primary field source for creating a substantial part of the magnetic field of the module, which can be combined with a secondary, lesser field creating source capable of altering the principal direction of magnetic field of the module as a whole, beneficial improvements can be made to achieving a uniform field from a discrete array of finite modules, organised in the example Halbach form. A particular benefit lies in the ability to produce standard field creating modules, capable of being set to a given principal direction of magnetic field in use, determined by the relative current values in the primary and secondary field sources. This capability also allows for adjustment and refinement in use of the uniformity and volume of the target MRI region. The Halbach type of discrete array of field sources produces a MRI field direction in the plane of the circular array contour.

The ability to alter the principal direction of the magnetic field of field creating modules by adjusting current values in the primary and secondary field source is also of benefit in the construction of "solenoid" MRI magnets. Again, the uniformity and volume of the target MRI region can be adjusted in use, where, for example, the field can be focussed or expanded with regard to a field of view. In this case, the direction of the MRI field lies in the direction of the co-axial axis of one or more circular arrays of modules, which replicate the field profile of a conventional LTS wound magnet.

In all the examples discussed in this patent application, the ability to adjust the principal direction of the magnetic field of modules provides for an adaptive capability in HTS MRI magnets. This is relevant to important applications where the capability to change the MRI field profile enables an extension to the range of imaging experiments that can be conducted.

Examples, of such being, Topological MRI or "focussed field imaging", Pre-polarisation imaging, Positron/Electron Resonance Imaging for "free radical imaging", Quadrupole imaging of chemistry in "soft solids", inter-operative imaging with switch off to allow approach of field sensitive equipment, like XR tubes. The adaptive capacity is also of general value in arranging for the magnet to simply adjust to changes in its environment field, and to correct for sample variations in local susceptibility which often occurs as a problem in the important and widely used imaging procedure known as functional MRI.

The primary substantial and secondary lesser field sources of each module have their respective current paths separately energised by independently operated power supplies, generally of the regulated current output type. The combined fields of the primary and secondary field sources are, therefore, programmable, and hence this invention concerns Programmable, Cold (cryogenic operation) magnetic modules. The preferred method of operating a magnet composed of one or more arrays of Programmable modules is in 'Cryo-resistive mode' so that adaptive control of field profiles is available when the magnet is in use. This invention is directed towards use of superconducting thin film layers in field modules, and that the current required in the both continuous and defined current paths of field modules is conducted when the thin film is at a temperature below its superconducting critical temperature. The critical temperature of both HTS and LTS conductors is that temperature at which the material undergoes a "second order" transformation between the normal and superconducting states. For practical purposes, this means that only at temperatures below the transition temperature can large specific currents be conducted. As the operating temperature of a HTS PCMM is reduced below the transition temperature of the thin film material forming current paths, so will the current conductivity of the paths increase. For cryo-resistive magnet operation, the power supplies "see" a resistive component in their output impedance load. The resistive component arises from the normal conducting materials comprising parts of the bus bar network employed to connect the HTS field sources to their appropriate power supplies, such that it is possible to independently supply variable values of current to field sources in order to adjust the value and the direction of their principal direction of magnetic field. Note that it is possible to employ support surfaces with superconducting thin film layers to form the bus bar network supplying current to primary and or secondary field sources, wherein only joints between the bus bar and continuous or defined current paths exhibit a small resistance.

A collateral benefit of the present invention is briefly referred to next. As shown in the examples of PCMM arrays for MRI magnets, section 5, where uniform MRI regions are developed in target volumes enclosed by the array contours, the actual dimensions of each PCMM can be small relative to the overall dimensions of the magnet. It should be pointed out that LTS Niobium Tin is generally used where the greatest field intensity is required for NMR magnets. However, NMR magnets have small sample sizes, typically a few millimeters diameter. Niobium Tin is a brittle inter-metallic compound with many of the mechanical limitations shown by HTS thin films. To accommodate Niobium Tin mechanical properties in the filamentary form necessary for LTS electrical stability, the superconducting LTS Niobium Tin is formed in situ as filaments in a composite matrix by reaction at elevated temperature (~750° C.) of components of the composite providing the continuous current path of the magnet. The current path is generally that of a helical form of many turns, as long lengths of composite can be conveniently co-processed. It has not proved possible to react the total structure of a Niobium Tin filamentary whole body MRI magnet in one helical current path enclosing the MRI volume due to problems of mechanical rigidity and temperature control. However, the concept of PCMM could deliver Niobium Tin continuous filamentary current paths on the modular scale of the discrete array of field sources. Because it is possible to make superconducting connections between Niobium Tin and other ductile superconductors, like Niobium Titanium, a superconducting network of current supplies is possible, thus enabling very high field MRI LTS magnets using the concept of PCM modular arrays.

Cryo-resistive magnets are not normally undertaken using LTS conductors because of the heat generated by parts of the bus bar network and conducted by the network from the environment is not economically removed using liquid Helium refrigeration. Said heat generation can cause the superconducting current paths to become unstable, ultimately returning fully to the non-superconducting state, which, in effect, causes the magnet to fail. HTS modules do not suffer this limitation on local heat generation because of the approximately 100 fold increase in the refrigeration efficiency and stability of the superconducting state at intermediate cryogenic temperatures. For the avoidance of doubt, the intermediate cryogenic temperatures for the operation of cryo-resistive magnets comprised of plurality of HTS field sources means operation in the range 20° K to 120° K. In addition, the modular field sources are maintained at a selected operating temperature within a vacuum insulated cryostat by emersion in a heat exchange medium, which is preferably a gas, but may be a liquid, such as liquefied Nitrogen or Neon. The heat exchange medium is circulated by mechanically forced convection and extracts heat from the magnet cryostat by transfer to an external heat sink, which is preferably a local mechanical refrigerator coupled to the cryostat with a heat exchanger. MRI magnets constructed solely using resistive material current paths are well known. Such magnets are usually forced cooled by air or water circulation, but the economics of cooling and power delivery restrict resistive whole body MRI magnets to low field values, typically some 0.2 Tesla.

Programmable modules that use HTS current paths can be equipped with persistent mode switches to provide partial or complete arrays of modules that deliver steady state persistent mode field stability, similar to that used in LTS whole body MRI magnets, as described in UK Patent Application No. 0903942.1 (set out in Appendix 1). It is generally desirable to provide MRI field uniformity stable in time to 10 ppm per hour and with 1 ppm or better noise at harmonics of the NMR frequency. LTS persistent mode magnets achieve this, but persistent mode is also a requirement of the liquid Helium refrigeration system, since for economic operation, it is necessary to remove normally conducting current leads from the cold environment. The HTS current paths in the field sources of the programmable cold magnet modules of this invention are stable against heat generated in current supply bus bars, and the bus bars normal conducting properties can be accommodated at intermediate cryogenic temperatures such that they present a low electrical resistance. For example, the cross section of parts of the bus bars can be substantial to reduce electrical resistance, and the commensurate increase in thermal conductance is a small economic penalty at intermediate cryogenic temperature refrigeration. In this way it is possible to deploy known power supply technologies to deliver the required electric current stability at low voltage/high current, and achieve the advantage of adaptive magnet control. Typical stabilisation technologies employ NMR field locks and temperature controlled environments for critical circuits.

Because HTS thin film materials need to be precisely controlled during deposition in regard to phase chemistry and crystallography, the preferred method of making electrical contact to established thin film layers is to deposit a layer of gold on the layer at a contact position. A normal contact material, such as copper, is formed into a geometrically matched surface to the thin film gold plated area, and itself gold plated. The two surfaces are held together across their interface by mechanical pressure in a suitable connector. Such connectors are preferably built into the frame giving physical support to the array of modules. The connectors are distributed appropriately in a wiring loom such that the modules of the array, and the primary and secondary field sources therein of each module, can be energised by a network of power supplies.

The primary and secondary field sources are in principle energised separately. In circumstances where it is required to replicate the net field profile of a module in other modules of a group of modules, so that each module contributes the same projected field profile to the MRI target field, modules may be connected in series. It can be desirable to connect the primary, substantial field creating sources in series for a group of modules, while connecting their, one or more, lesser field creating sources in parallel, such that the net field profile of the modules in the group differ from each other when in use, but the projected field values of the modules of the group are, broadly of similar value. Further, programmable cold magnet modules with the built in capacity for adjustment of their principal direction of magnetic field in two or three dimensions, are equipped with parallel connections to the more than one lesser secondary field sources, for more than one power supply. In order to adapt the magnetic field in the target MRI region in use, the programmable cold magnet modules are connected to power supplies which are under the control of a computer. The computer runs programs suitable for converting required field profile in the target MRI region into the projected field profiles required from each module in order to achieve the MRI field profile by combining the projected fields. In turn, the current values supplied to the primary and secondary field sources needed for direction of the projected field of each module are available to the computer program as a data set defined out of the design of the arrays comprising the magnet. Automated adaptation of the MRI field in the target region is achieved using feed back loops with input from field intensity and field gradient sensors.

It is important to note that in general use of PCM modules arrayed to produce target volume of uniform field suitable for MRI, the principal direction of magnetic field of the secondary, lesser adapting field source may either aid or oppose the principal direction of the magnetic field of the primary, substantial field creating source. The electric current used to energise primary field sources may flow in either a positive or negative sense relative to current use to energise secondary adapting field sources. In particular, for the creation of a target MRI field profile, the computer control system may change the value of current flowing in secondary field sources from the positive to negative sense relative to the primary field sources. This may be done dynamically when the PCM modular array is providing an adaptive magnet. It should be noted that appropriate target MRI field profiles may be achieved under some circumstances with no current being supplied to the secondary field creating sources of some modules in an array, whereby the target field is achieved by, say, reducing a current flowing in the secondary sources in the positive relative sense towards a reversal of said current, but the target profile is achieved exactly on balance of current flow in the secondary sources between the positive and negative sense.

Examples of Programmable Cold Magnet Modules (PCMM) in Arrays for MRI Field Creation
Brief Description of MRI Array Key Features Derived from PCMM Properties Five examples of MRI magnets are described in this section, where the MRI field profile in a target region partly enclosed by arrays of PCM modules is derived by calculation of the field of each module projected into the MRI region. In the examples, diagrams illustrate the essential features of the PCMM array geometry.

Examples are referred to as:
(a) x6 circular co-axial arrays with field rotation along array contour, with particular reference to adapting the profile of the MRI field using small variations of current in groups of the secondary lesser field sources of the field modules;
(b) x1 circular co-axial array with field rotation along array contour using race track spiral surface paths in the primary field source of the field modules, and circular closed surfaces with defined helical current paths on the secondary, lesser field sources, with particular reference to adapting the "coarse field" projection of the primary substantial field source for MRI field uniformity;
(c) x2 circular co-axial arrays with PCMM principal direction of magnetic field broadly parallel to the direction of the MRI field, and constant along the array contour, with particular reference to the "coarse field" of the primary field source, being in this case a flat spiral conducting surface, being adapted by the defined current path of a helix on the closed conducting surface of the secondary lesser field source. The primary field source is sub-divided into two co-axial flat spiral paths;
(d) x2 circular co-axial arrays with PCMM principal direction of magnetic field broadly parallel to the direction of the MRI field, and constant along the array contour, with particular reference to the "coarse field" of the primary field source, being in this case a flat spiral conducting surface, of thin dimension with respect to its axis of rotation, and tilted such that the principal direction of magnetic field intersects at a small angle with the direction of the MRI field. The secondary lesser field source comprises four tilted concentric closed cylindrical surfaces, each with helical defined current paths; and
(e) x4 circular associated co-axial arrays with field direction parallel with their axis of symmetric rotation, with the field opposed across the mid plane of the associated arrays, i.e. arrays are considered as two pairs across the mid plane. In addition, a further set of x2 circular associated co-axial arrays with field direction parallel with their axis of symmetric rotation is arranged such that their axis of symmetric rotation intersects the first axis of symmetric rotation on the mid plane of that axis, and to be orthogonal to that axis.

Classes of PCMM

For convenience, PCM modules can be classed with respect to the relative orientation of the principal direction of magnetic field created by the primary and secondary field sources. The grouping of PCMM in arrays using the concept of an array contour passing through the magnetic origin of each module, where the contour follows the shortest path between the origins of arrays, has been discussed in UK Patent Application No. 0903942.1 (set out in Appendix 1) as a means to define a system to create a MRI field based on the combined projected fields of a discrete set of field sources. Practical MRI magnets using discrete field module arrays comprise one or more arrays in association, where the more than one array combine to form the MRI field of a required uniformity. Each array of the associated set comprising the MRI magnet is defined by a contour that does not intersect with that of any other array in the set.

Classification—Common Features of Programmable Cold Magnet Modules

All classes of modules include a primary substantial field creating source, utilizing one or more continuous conducting layer paths on a support surface, with a current input and extraction terminal. The conducting path is either formed as an integral layer of the surface by coating, or by joining a layer temporarily supported on a precursor, joined during module assembly to a sufficient support layer. The continuous conducting path has the geometry of a spiral, such that the continuous conducting path increases in radius with subtended angular distance along the path. In addition, the spiral path can progress along the axis of rotational symmetry with the subtended angular distance along the path. Generally, the continuous conducting paths can be described as ranging from the geometric form of a flat spiral to that of a conical spiral.

All classes of modules include a secondary lesser field creating source, utilizing one or more continuous surface defined current paths formed on a conducting layer coating a closed curvilinear support surface. The conducting path is either formed as an integral layer of the surface by coating, or by joining a layer temporarily supported on a precursor, joined during module assembly to a sufficient support layer. The continuous surface defined current paths enclose an area of the conducting layer with one or more circulations between a current input and extraction terminal, where a commonly deployed path geometry is that of a helical path on a cylindrical or conical support surface.

All classes of module have terminations of the current paths of the conducting layers such that the primary field sources may be separately energised from the secondary field sources, thereby permitting the projected field at a point from a PCMM to be varied in intensity and vector direction through the point using external control of supplied currents.

For the avoidance of doubt concerning current paths used to create field in PCM modules, FIG. 1 shows the essential geometric features of a flat spiral, a conical spiral, and a helix.

Classification—Operational Features of Programmable Cold Magnet Modules

Class 1 PCMM

Figure 2A:
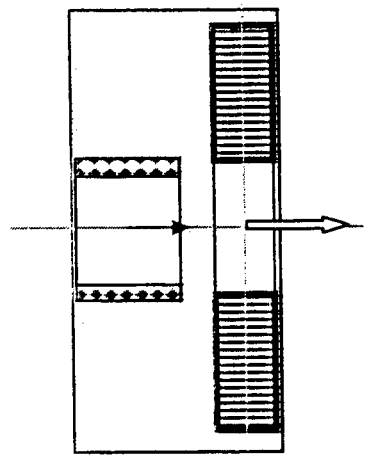
FIG. 2A is a section through Programmable Cold Magnet Module, shown is examples of primary substantial field source and secondary lesser field source: co-axial source geometry, PCMM class 1, origins of primary and secondary field sources lie on common co-axial axis, either coincident or radial displacement.
Figure 2B:
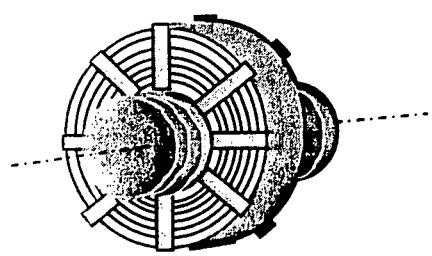
FIG. 2B is an isometric view of a class 1 Programmable Cold Magnet Module (PCMM) showing spacing apart of radial overlapping turns of a spiral support surface.

FIG. 2A section through flat spiral continuous conductor surface primary source and smaller radius cylinder secondary source, FIG. 2B isometric view.

Figure 3A:
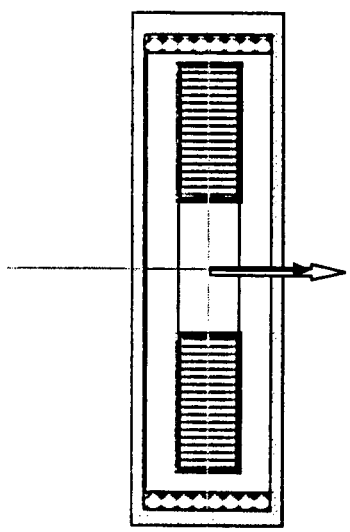
FIG. 3A shows a section through a Programmable Cold Magnet Module, shown is examples of primary substantial field source and secondary lesser field source: The primary source comprising radially overlapping spiral HTS precursor on a support surface and the secondary source comprising coated support cylinder with a lithographed current path "cut" into the HTS coating. Shows co-axial source geometry, PCMM class 1 secondary source larger diameter than primary source.
Figure 3B:
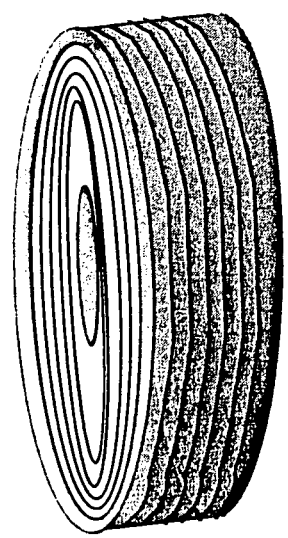
FIG. 3B is an isometric view of PCMM class 1, primary source inside diameter of secondary source.
Figure 4:
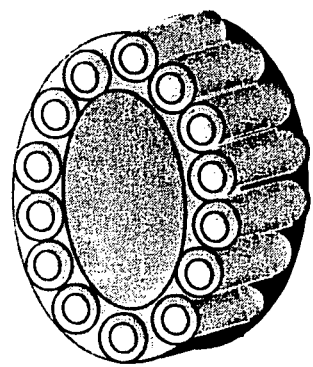
FIG. 4 shows PCMM modules on circular array contour; common direction of module magnetic fields.

FIG. 3A section through flat spiral primary source and larger radius cylinder secondary source, FIG. 3B isometric view, FIG. 4 isometric view PCMM typical "solenoid" array Origins of primary and secondary field sources lie on common co-axial axis, and origins are either coincident or axially displaced. Field sources have dissimilar axial length of current distribution Typical purpose is to fine tune intensity of projected field profile and adapt affective length of magnetic dipole, as well as to control field rotation through the spiral continuous path, so as to maximise uniformity of current density in the current path of the primary field source.

Class 1 PCMM is relevant to arrays simulating solenoid fields and to coarse rotation along an array contour of module principal direction of magnetic field using PCMM orientation.

Class 2 PCMM

Figure 5A:
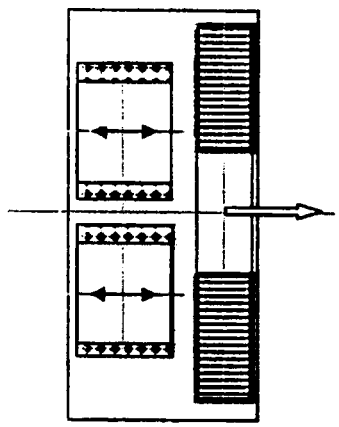
FIG. 5A shows an arrangement that can enable rotations of the principal direction of magnetic field in one plane and, in particular, a section through flat spiral continuous conductor primary source and multiple smaller radius cylinders secondary source PCMM class 2 Origins of primary and secondary field sources lie on parallel axis, origins separated with respect to radius and parallel axis.
Figure 5B:
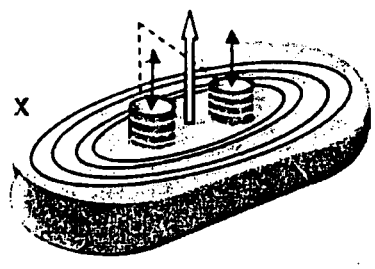
FIG. 5B shows an isometric view, where flat spiral primary source has an elliptic continuous current path and further, the secondary field sources are HTS coated cylinders with lithographed current paths, and the cylinders are not on a common axis of rotation with each other or the ellipse. This arrangement can correct end effects in the primary field source or rotate the principal direction on magnetisation in one plane.
Figure 5C:
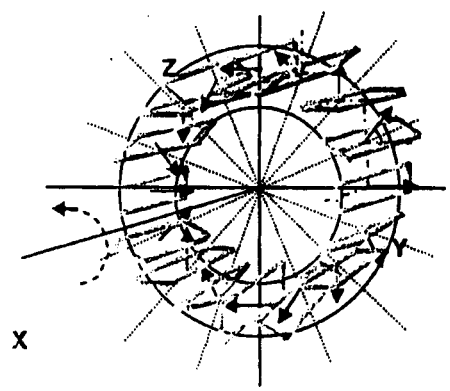
FIG. 5C shows an isometric view PCMM typical field rotation along array contour using elliptical flat spiral primary source.

FIG. 5A section through flat spiral continuous conductor primary source and multiple smaller radius cylinders secondary source, FIG. 5B isometric view, where flat spiral primary source has an elliptic continuous current path. FIG. 5C isometric view PCMM typical field rotation array using elliptical flat spiral primary source.

Figure 6A:
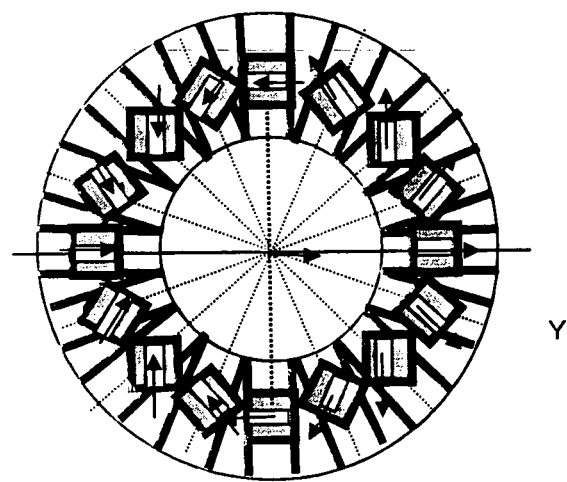
FIG. 6A shows a section PCMM typical field rotation along array contour geometrically adapting field direction. The direction of a transverse field is indicated by the arrow at the centre of the circular array while the field directions of each PCMM are indicated by a corresponding arrow at their origin.
Figure 6B:
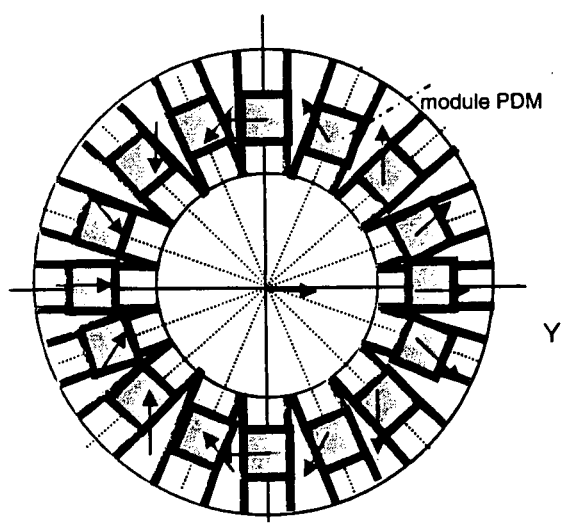
FIG. 6B shows a section PCMM typical field rotation array using adaptive field direction where PDM denotes principal direction of magnetic field.

FIG. 6A section PCMM typical field rotation array using geometric field direction, FIG. 6B section PCMM typical field rotation array using adaptive field direction. In FIG. 6, the principal direction of magnetic field is in the direction shown as Y. The principal direction of magnetic field in this context is the direction of magnetic field at the origin of a field source in air (i.e. there is no magnetise-able material at the origin) or the principal direction of magnetisation if magnetise-able material is present at the origin (e.g. the core of a magnetic field source comprises iron).

Origins of primary and secondary field sources lie on parallel axis, and origins are separated with respect to radius and parallel axis. Field sources have dissimilar axial length of current distribution. Typical purpose is to adapt in 2D the module principal direction of magnetic field.

Class 2 PCMM is relevant to arrays where there is rotation along the array contour of the principal direction of magnetic field of the module by PCMM adaptive means.

Class 3 PCMM

Figure 7A:
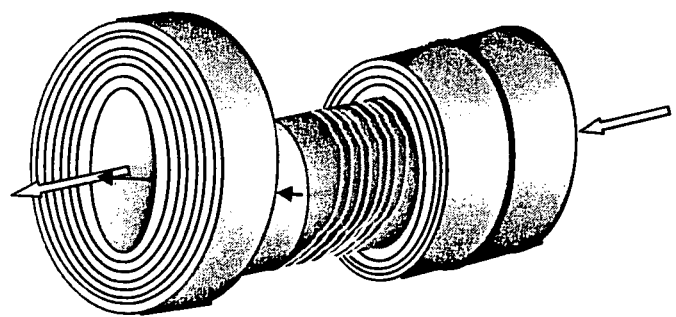
FIG. 7A shows an isometric view of primary field source comprised of more than one spiral continuous conductor surface path and secondary source comprised of cylinder coated surface with defined current paths PCMM class 3 Origins of primary and secondary field sources lie on intersection axes defined by each direction of principal magnetisation, and origins are separated with respect to radius and distance along intersecting axis. Field sources have dissimilar axial length of current distribution.
Figure 7B:
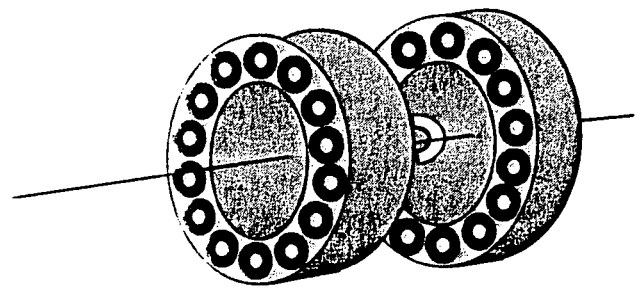
FIG. 7B isometric view of PCMM typical solenoid field array, where two arrays are shown in association.

FIG. 7A is an isometric view of primary field source comprised of more than one spiral continuous conductor surface path and secondary source comprised of cylinder coated surface with defined current paths. FIG. 7B is an isometric view of PCMM typical solenoid field array, where two arrays are shown in association. The white cusp illustrates the isometric boundaries of the MRI region.

Figure 8A:
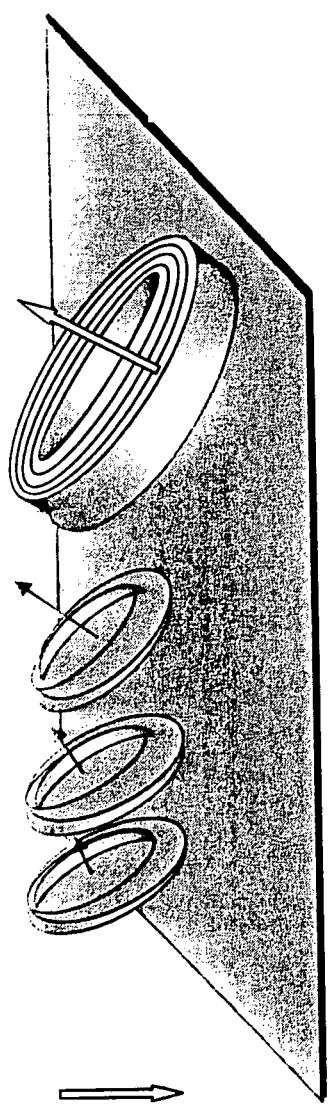
FIG. 8A is a further drawing of a class 3 PCMM class 3 showing an isometric view of primary field source comprised of one spiral continuous conductor surface path and more than one cylinder or disc coated surface with defined current paths. The principal direction of magnetic field for the defined current paths is substantially rotated from the direction of the MRI field.
Figure 8B:
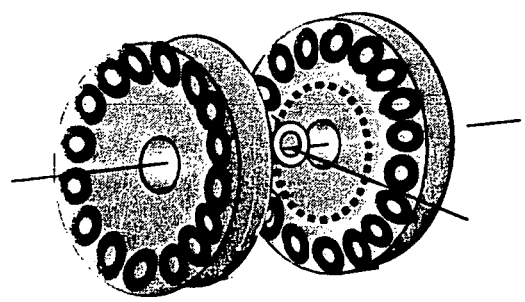
FIG. 8B shows an isometric view of PCMM typical solenoid field array, where two arrays are shown in association comprised of more than one secondary field source.

FIG. 8A is an isometric view of primary field source comprised of one spiral continuous conductor surface path and more than one cylinder or disc coated surface with defined current paths. The principal direction of magnetic field for the defined current paths is substantially rotated from the direction of the MRI field, where the modules produce a solenoid simulating field when arrayed in circular contours. The block arrow indicates the relative direction of the MRI field. This isometric view is of a radial segment through four circular contours about the MRI field direction close packed with PCMM forming equivalent positive and negative current loops FIG. 8B is an isometric view of PCMM typical solenoid field array, where two arrays are shown in association comprised of more than one secondary field source. The solenoid field array illustrates the secondary field sources by the dots on the inner isometric face of the right hand pole.

Origins of primary and secondary field sources lie on intersection axes defined by each direction of principal magnetisation, and origins are separated with respect to radius and distance along intersecting axis. Field sources have dissimilar axial length of current distribution. Typical purpose is to adapt in 2D the module principal direction of magnetic field.

Class 3 PCMM is relevant to arrays simulating solenoid fields, where the direction of the MRI field is generally in the direction of the principal direction of the magnetic field of the module, which latter can be adjusted in two dimensions, where in a circular array fine control is required to achieve the best available MRI field uniformity using adaptive means.

Class 4 PCMM

Figure 9A:
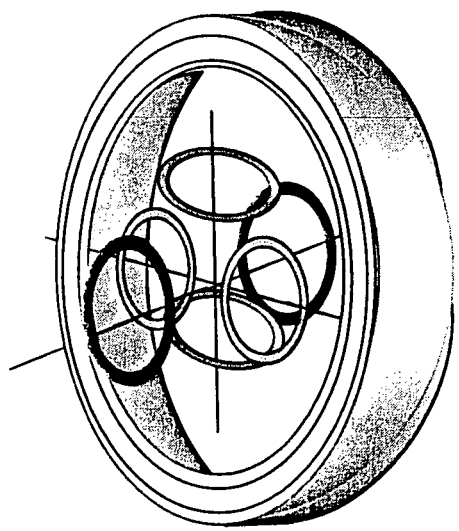
FIG. 9A is an isometric view of primary field source comprising one or more spiral continuous conductor surface paths and more than one cylinder or disc coated surface with defined current paths comprising more than one secondary field source. PCMM Class 4 Origins of primary and secondary field sources lie on intersecting orthogonal axes defined by each direction of principal magnetisation, and origins are either common at the centre of the orthogonal system, or separated along the orthogonal axes. Field sources have dissimilar axial length of current distribution.

FIG. 9A isometric view of primary field source comprising one or more spiral continuous conductor surface paths and more than one cylinder or disc coated surface with defined current paths comprising more than one secondary field source.

Origins of primary and secondary field sources lie on intersecting orthogonal axes defined by each direction of principal magnetisation, and origins are either common at the centre of the orthogonal system, or separated along the orthogonal axes. Field sources have dissimilar axial length of current distribution. Typical purpose is to adapt in 3D the module principal direction of magnetic field.

Class 4 PCMM is relevant to arrays where there is rotation along the array contour of the principal direction of magnetic field of the module by PCMM adaptive means. Also, multiple associated circular arrays are deployed, such that small rotation of module fields in the direction of the co-axial axis is desired for fine tuning, as well as significant control of field rotation along each array contour.

Figure 9B:
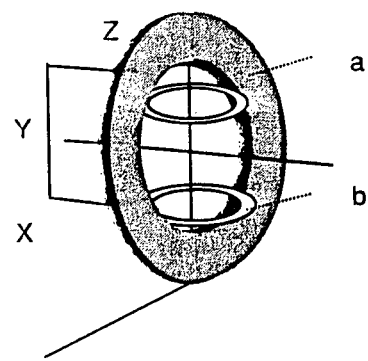
FIG. 9B shows an isometric view of a typical module for adaptation of orthogonal field directions.

As an indication of the scale of adaptation of the principal direction of magnetisation of a PCM module typically desired for constructing arrays with rotation of the field direction along the array contour, the following simple example is provided. FIG. 9B shows a typical module for adaptation of field direction in a plane e.g. YZ FIG. 10 shows a table of dimensions for a primary substantial source comprising a continuous current path in the form of a flat spiral, and a secondary lesser source comprising a coated surface in the form of a cylinder, where in the YZ plane, the axis of rotational symmetry of the secondary source is at 90 degrees to that of the primary source.

It can be seen for that for convenient dimensions given in FIG. 10, a spiral conducting surface, approximately 190 meters in length, and a coated cylinder with a defined helical path, approximately 4 meters in length, it is possible to redirect the principal direction of the magnetic field of the module by +/−8 degrees.

Associated Arrays and Symmetry Criteria

It is part of this invention that achieving a MRI magnetic field comprises arranging PCMM in arrays, i.e. groups, where each PCMM has a defined current path which assigns a projected field profile to each PCMM, and in the target MRI region projected fields are combined to form a suitable field for PCMM as field sources are arranged in arrays determined by a curvilinear contour passing through the magnetic origin of each source by the shortest route. The defined field current paths are unique to the profile of the MRI field and the manner in which arrays are populated with PCMM, and, finally, to the manner in which arrays are associated with each other by shared axes of symmetry. By, these means the distribution of current about a target MRI region is defined in three dimensional space.

In principle, there are an infinite number of ways field sources may be arranged to create a specified MRI field profile within a set of boundary conditions. In practical terms, it is essential to use the minimum number of PCMM field sources in the smallest number of independent arrays so as to use as little HTS thin film conductor as possible. An array is considered independent if the array contour is non-intersecting with that of any other array. Very often, the array contour of an array will be closed, so the arrangement of PCMM replicates an equivalent path for current to circulate in a closed loop and produce a solenoid field.

In order to approach the best possible efficiency of MRI magnet design, the shared axes of symmetry for associated arrays are chosen to be as simple as possible. This means that the axes of symmetry associating arrays with each other are chosen such that the least number of operations are required to return the magnetic origins of all the PCMM to their original locations after an arbitrary displacement is applied to the array set comprising the MRI magnet. By operations is meant, reflection across a mirror plane, rotation about an axis, or inversion across a plane. An array is symmetric to another array if it is obtained from the first array by prescribed operations.

Examples have been given of circular associated arrays where the shared axis of symmetry is defined as an axis of shared rotational symmetry. That is, the axis of rotational symmetry passes through the centre of the MRI region, and a uniform rotation of all associated PCMM arrays about the axis of symmetry does not change the location or profile of the magnetic field in the MRI region. In the case of the association of arrays in which the principal direction of the magnetic field of each PCMM is the same relative to the principal direction of the magnetic field in the MRI region, the array association simulates the current distribution of a solenoid MRI field for example FIG. 24.

In the case of circular associated arrays with, not only a shared axis of rotational symmetry, but also with rotation along each array contour of the principal direction of magnetic field provided by PCMM, see FIGS. 5 & 6, the direction of the MRI field is transverse to the shared axis of symmetry. Strictly speaking, this arrangement of PCMM has a more complex symmetry than the solenoid. This is because rotation of associated arrays about the shared axis of rotational symmetry also rotates the direction of the MRI field, so rotation is not an invariant transformation of the magnet. However, to all intents, the uniformity of the MRI field is not changed by rotation, so the practical symmetry, and therefore, choices for relative locations of array can be handled as for the solenoid case; see FIGS. 14, 15, 16, 17.

Figure 27A:
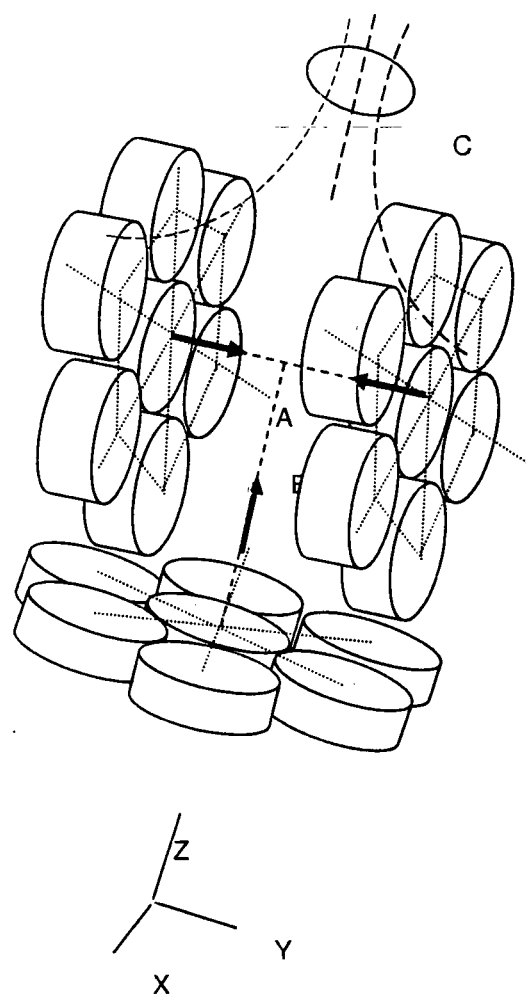
FIG. 27A Illustrates a PCMM magnet with associated arrays in two fold symmetry, and close packed PCMM pole pieces. A is the separation axis of rotational symmetry, B is the orthogonal axis of rotational symmetry, C is the location of the MRI zone. Co-ordinates X,Y,Z are shown.

More complex symmetries for association of arrays are possible. What is described by FIG. 27A is the means to achieve desirable, but asymmetric, location of the target MRI region with respect to the PCMM arrays. In particular, it is advantage for open access MRI, as would be desirable for imaging during interventional procedures, to project the MRI region beyond the "best" axes of shared symmetry of the PCMM arrays. One example is described based on a solenoid geometric symmetry for arrays which themselves may have circular or race track contours. This example also has a second set of associated arrays sharing a common axis of rotation, but this axis is orthogonal to the axis of rotation shared by the solenoid array. Thus, there exists in this MRI magnet system a two fold degree of rotational symmetry and, importantly, the location and uniformity of the target MRI region can be altered by changes to the current distributions about the two fold axes of rotational symmetry. The benefits to MRI magnet performance are illustrated by this example in which the properties of associated arrays are design variables in two fold symmetry.

Maths Methods Used for PCMM Calculations—Vector Field Evaluation

In providing examples of PCM modules, organised in associated arrays suitable for MRI magnets, the vector field describing the MRI target volume is calculated from the current paths of the primary substantial field source and the secondary lesser field source for each module in the magnet. Standard calculation methods are used, described in UK Patent Application No. 0903942.1 (as set out in Appendix 1). However, in this invention, because there are at least two current paths per module, being as a minimum, a continuous conducting path in some type of spiral geometry, and a defined path on a closed conducting surface, it is necessary to represent the field sources of each module by direct calculation of the field effect of current in each element of the paths. This requires open solutions using numerical methods, because analytical expressions are generally not available to handle multiple paths in a variety of relative orientations.

In this description computer algorithms based on Ampere's theorem are used to obtain values of field vectors at points required in the MRI target region. The field effect due to the current in the paths of the sources of the array modules is calculated for finite elements of the current paths. The total value of the field vectors at any point is obtained finally by summation of the field effects of all path elements.

Figure 11A:
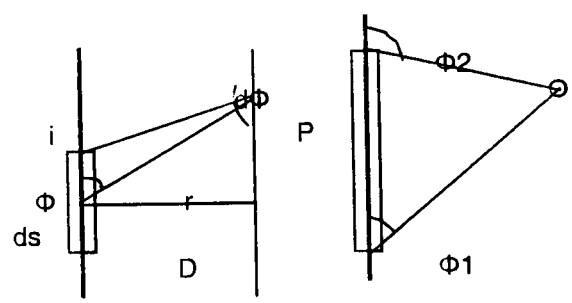
FIG. 11A shows a co-ordinate system relating current element of a conducting path to an arbitrary external field point in a 3D vector field, basic algorithm core for finite element field calculation.

Equations Referring to the Situation Shown in FIG. 11*a*

$dH = ids \sin \phi / r^2$ Ampere's theorem $dH = (\mu_0 i / 4\pi) ds \sin \phi / r^2$ In SI units Amperes/meter For Integration of current elements and their field effects at a point $B = \mu H = \mu i / 4\pi \int ds \sin \phi / r^2 \lim s - \infty/\infty$ $B = \mu H = \mu i / 4D \int \sin \phi d\phi \lim s - \infty/\infty$ $B = \mu H = \mu i / 4D [-\cos \phi] \lim \phi_1/\phi_2$ Where successive integration between limits $\phi_{ij}$ deliver the field at point P due to the current path $\int ds$. with relative dimensions of field point to current element given in FIG. 1

A subsidiary method employing expressions for the field of a current loop is used with less demanding input definition of the current paths, in cases where the current path is circular in primary and secondary field sources of the modules. The current paths generally have spiral or helical geometry. Their field effects, when projected distances of the same order as path radius, are represented in a good approximation as concentric loops of current, distributed with a defined radial and axial build about a reference point on the array contour. The loops may have any set of Euler's angles relative to each other.

Figure 11B:
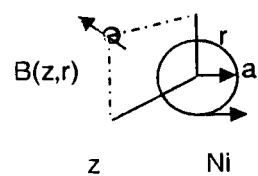
FIG. 11B shows a co-ordinate system relating current loop conducting path to an arbitrary external field point in a 3D vector field, basic algorithm core for finite element field calculation.

Equations Referring to the Situation Shown in FIG. 11b $$Hz(z,r)=2Ni/10a\{A*[K(\phi)*k+B/C*E(\phi)*k]\}$$

$$Hz(z,r)=2Ni/10a(z/r)*\{A*[-K(\phi)*k+D/C*E(\phi)*k]\}$$

Where a=loop radius, r=fld point radius, z=axial separation point to loop plane
Also $$\text{where } A=1/\{(1+r/a)^2+(z/a)^2\}^{1/2}$$

$$\text{where } B=1-(r/a)^2-(z/a)^2$$

$$\text{where } C=[1-(r/a)]^2+(z/a)^2$$

$$\text{where } D=1+(r/a)^2+(z/a)^2$$

where k is the modulus of the elliptic integrals of the primary and secondary kind $$k=\{4(r/a)/[(1+r/a)^2+(z/a)^2]\}^{1/2}$$

where expansions of the elliptic series are numerically tabulated $$K(\phi)n=\pi/2\{1+(1^2/2^2)k^2+(1^2*3^2/2^2*4^2)k^4+(1^2*3^2*5^2/2^2*4^2*6^2)k^6\ldots\}$$

$$E(\phi)n=\pi/2\{1-(1/2^2)k^2+(1*3/2^2*4^2)k^4-(1*3^2*5/2^2*4^2*6^2)k^6\ldots\}$$

It is convenient in a computer algorithm to set each current loop in a Cartesian co-ordinate system so that the vector field is defined at each required point B(z,r) as components Bx, By, Bz and the co-ordinate displacements x, y, z. This allows for rotation of each loop at its origin relative to the co-ordinate frame, and, also, for displacement of loops to source origins in the frame.

Maths Methods Used for PCMM Calculations—Optimisation of PCMM Type within Associated Arrays In summary, the optimisation of module and array combinations against a target MRI field specification is undertaken using computer based numerical methods with multi variable input, and sensitivity analysis applied to step wise changes in values of input variables. Binns, Lawrenson, and Trowbridge in "Analytical and Numerical solution of Electric and Magnetic fields" discuss the form of computer algorithms necessary for successful optimisation of multi-component field problems. It should be noted that, in this invention, a particularly advantage use of PCM modules is to rotate the principal direction of the magnetic field of modules along the array contour. The use of the secondary lesser field source is a significant capability of PCM modules in this context. Field rotation along a contour has the basic property of "containing" a higher proportion of the field energy in the MRI target region, compared to replication of a solenoid field using modules with a constant principal direction of magnetic field along the array contour. However, with such field rotation, the combined projected field profile is generally of considerable sensitivity to the degree of sub-division of the origins of the rotated field along the contour. Therefore, the optimisation to obtain a confident best result of rotated sets of PCM modules ultimately needs to include several variables of the field sources, based on the distribution, orientation and density of current paths.

In this description of PCMM arrays, in order to demonstrate the benefit of modules with a primary field creating source and a secondary field profile adaptation source, the affect of alteration of a single variable on MRI field is assessed using one field sensitivity parameter, usually current distribution within modules and between associated arrays. Because uniformity of the MRI field is the target, the approach to cancellation between sensitivity terms in expressions representing the field contributed by the current paths of sources (modules grouped in arrays) indicates the approach to a uniform field solution. A single variable optimisation is in affect a systematic trial and error demonstration. It should be noted that uniformity of MRI field achieved between limits along a given field vector, provides a similar level of uniformity along orthogonal vectors, relying on the divergence theorem, and thus a target region with a volume of uniformity is identified. Optimisation using computer algorithms comparing more than one variable in parallel cycling could be applied to the MRI magnet constructed of PCM modules. For example, genetic algorithms have been used to test the fitness of arbitrary initial distributions of current paths for LTS MRI field creation, in which fitness criteria can include such as total system stored energy, diversity of module type, boundary complexity of associated arrays, or minimum volume of HTS thin film material.

It is usual to calculate the value of the MRI magnetic field along the axis of highest symmetry of the associated arrays, which is generally the principal direction of the MRI field the arrays create. In order to demonstrate the use of PCM modules in arrays suitable for MRI magnets, sensitivity of the MRI field uniformity to the distribution of current values in a given group of prescribed field sources is examined. The sensitivity is expressed in terms of the coefficients of polynomials fitting the numerical profile of the field contributions of arrays to the target volume, or segments there-off, along the given axis. It is not possible to obtain expressions of field sensitivity to source variables by differentiation, other than numerically, when open expressions are used to relate field to current distribution. Normally, the convergence of field at a point from a given distribution of sources can be defined from the value of the field function at a point and analytical expressions of the field derivatives through the point (Taylor's method). A direct measure of the contribution to the MRI field profile made by any group of field sources can always be made using the numerical output of algorithms based on the methods of section 5.1.2. However, the development of sensitivity coefficients using polynomial fit techniques allows a more responsive measure of trends in field profiles as influenced by variables of the array, because comparisons of small difference between relatively larger field values can be avoided.

In outline, the following method is used to organise PCM modules in arrays for uniform MRI field profile in a target volume, to an initial level of optimisation under considerations explained above.

STEP 1: Calculate MRI field profile from a putative set of associated arrays by the methods of described above, comprised of one or more types of Programmable Cold Magnet modules. Typically simple modules are used initially with one spiral primary field source and a two dimension field adaptation system of secondary lesser field source, comprised of coated cylinders or cones. Circular array contours are typically employed to begin with and the preferred array format is that for rotation of the principal direction of magnetic field of modules along the contour.

STEP 2: The projected field contributions of groups of modules are calculated in the MRI target volume. Typically the set of sources for field contributions would be the primary field sources along each array contour and the secondary field sources along each array contour. Groups of modules along array contours would have their field contributions calculated in circumstances where the properties of the MRI field of interest lay along an axis normal to the co-axial axis of an associated set of arrays, typically represented by a magnet based on rotating the principal direction of magnetisation along the array contours. The functions of field due to combine field projections from sets of modules are curve fitted by polynomial expressions of field against the chosen variable, say current in the source current paths, or distribution of current in space.

STEP 3: A matrix is populated with the polynomial coefficients for simultaneous solution using the array variable, where the solution aims to cancel the sum of coefficients of the same order, while providing a target field value at a point in the MRI volume. This point typically is the origin of the system of associated arrays, which gives the limit of field uniformity at the origin of the arrays, and the best optimisation is achieved, subject to sensitivity of field to the source variable. The more are the groups of sources used, the more polynomial coefficients are entered into the optimisation, which improves the MRI field volume with "best available" optimisation.

Example of Equations for Three Sets of Array Sources, which could be Circular Co-Axial Arrays on One Side of a MRI Magnet with Respect to its Origin.

Polynomial fit of field versus array module common current, for arrays a, b, c $$B_{ya} = a1y^2 + a2y + a3$$

$$B_{yb} = b1y^2 + b2y + b3$$

$$B_{yc} = c1y^2 + c2y + c3$$

Population with transposition of matrix for simultaneous solution of common current factors against field targets at the origin of the MRI magnet.

$$B_{ya}X1 + B_{yb}X2 + B_{yc}X3 = C1 = \Sigma \text{ By target at origin}$$

$$a1y^2X1 + b1y^2X2 + c1y^2X3 = C2 = 0$$

$$a2yX1 + b2yX2 + c2yX3 = C3 = 0$$

where $X_i = Nl_i$, the common current factor of the ith source set.

Solution for X1, X2, and X3 gives the ratios of Ampere-turns of the source set.

Examples of the Capabilities of PCM Modules in Use to Improve the Performance of HTS MRI Magnet Arrays A brief overview is given above of the array and module features for MRI HTS magnet performance relating to demonstration of the benefits this invention. In this section is presented in numerical forms, examples of manipulating MRI field properties in a target region using the primary and secondary field sources of HTS PCM modules.

Circular Co-Axial Arrays x6 with Field Rotation Along the Contours of the Arrays Set Up and Demonstration Considerations Item 1: Dimensions of a circular array comprised of 16 PCMM are given in FIG. 12A, along with the dimensions of the current paths used in field calculation. The dimensions of the circular array are quoted in the YZ plane, FIGS. 12A and 12B, and in the demonstration, the six arrays are placed at various distances along X (common co-axial direction), where the distance between arrays is an optimisation variable, see item 6. The geometry of the primary and secondary field source is that shown in FIG. 12C.

Item 2: The nominal principal direction of magnetic field rotates along the array contour, by $x2\phi$, where $\phi$ is the angle subtended by the magnetic origin of each PCMM at the centre of the array. For example, FIGS. 12A and 12C

Item 3: There are six circular arrays in association in the MRI magnet, arranged on a common axis through the origins of the circular arrays, each with 16 PCMM, shown in isometric form in FIG. 13

Item 4: The direction of the MRI field lies in the plane of the circular arrays, being normal to the co-axial direction of the arrays; FIG. 12B. The black arrows of FIG. 12B indicate local principal direction of magnetic field. In the context of MRI magnets, the MRI field direction is transverse to the direction of patient axis in this example, where the latter is along the direction of the co-axial axis, X direction FIG. 12.

Item 5: The optimisation target is to achieve a uniform field in the transverse direction along a given length of the co-axial axis, centred on the mid plane of the six arrays normal to the co-axial axis, at the largest diameter practicable using the optimisation variables, FIG. 13.

Item 6: The optimisation variables are; value of transverse field due to each x16 circular arrays on the co-axial axis as a function, firstly of distance along the co-axial direction from the mid plane of the six arrays, and secondly of average current in each array, where the current is the same in each PCM module of a given array.

Item 7: The degree of field rotation along the contour of arrays achieved by summing the projected field of all 16 PCMM/array is not exactly $x2\phi$. This is demonstrated in detail below. The positions of the magnetic origins of PCMM around the circular array, as dictated by the initial choice of PCMM dimensions, are not optimised for the interactions between associated arrays, see FIGS. 6A and 6B.

The ability to adjust the principal direction of magnetic field of individual modules allows for arrays to be tuned for further improvement of field uniformity, both in practice using feed back from field profile sensors, such as NMR line width, and at the design stage by multi parameter optimisation exercises.

Figure 13:
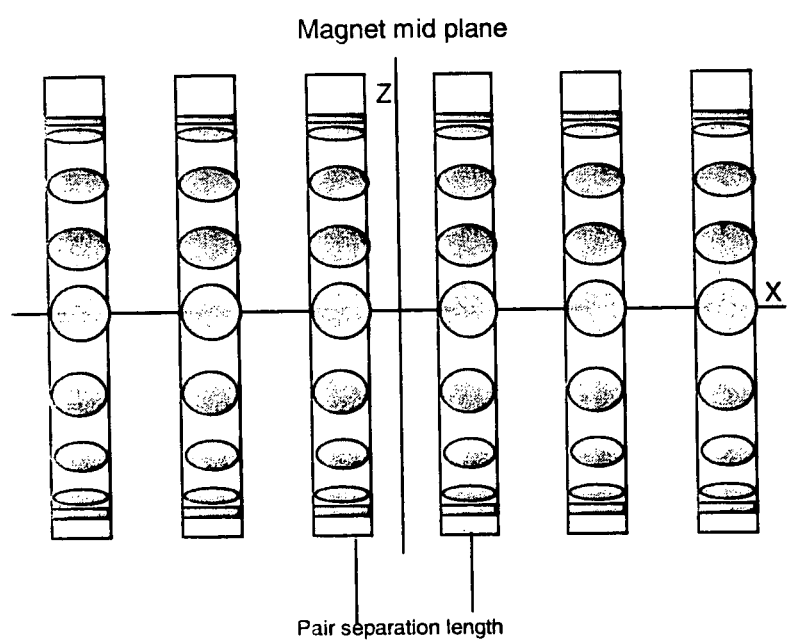
FIG. 13 is a diagram of a PCMM magnet comprising six circular arrays with generally cylindrical modules providing geometric field rotation along the array contour.

Item 8: The first demonstration comprises the calculation of the transverse field due to each of three pairs of circular arrays, on, and along, the co-axial axis X from the mid plane of the magnet, FIG. 13 shows an isometric view. In this example the methods described above are used, particularly representing primary field source current paths by concentric loops. The distribution of average current in the modules of the three array pairs is shown for different separation distances of the pairs of arrays, as the current ratio between the pairs is adjusted to achieve a uniform transverse field, initially +/−500 ppm variation from the value on the mid plane, for a practically achievable length of the order of +/−5 cm along the co-axial axis.

Item 9: The second demonstration is to take the axial spacing of pairs of circular arrays derived in Item 8 above, and make fine adjustment to the average current distribution of the three pairs of arrays, against further improvement in the uniformity of the transverse field on, and along, the co-axial axis. The adjustment would be made in practice using the fine level of current/field control of modules in the identified array using the secondary lesser field sources.

Item 10: The optimisation output is shown in FIGS. 14 to 17

Description of First Demonstration Output

Figure 14A:
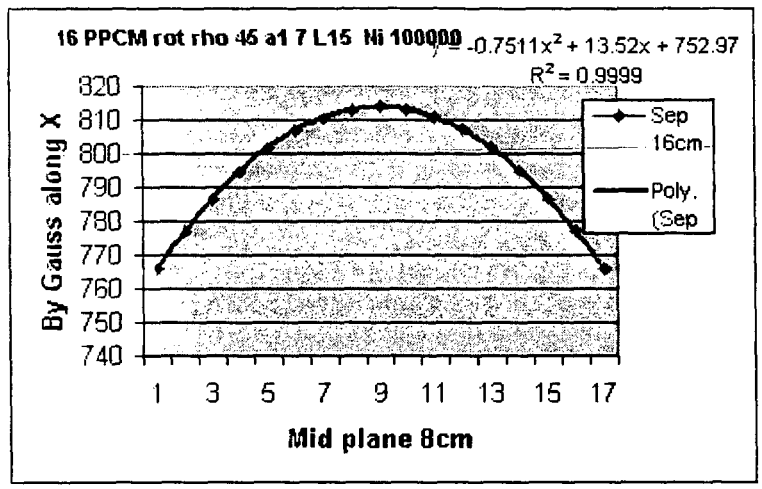
FIG. 14A shows a profile of the transverse MRI field along the co-axial axis of a six array magnet with field rotation along array contours: inner pair of arrays about magnet mid plane.
Figure 14B:
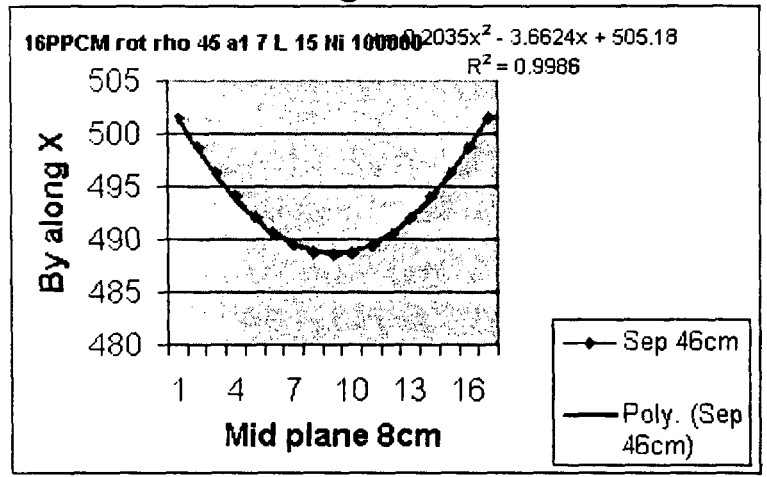
FIG. 14B shows a profile of the transverse MRI field along the co-axial axis of a six array magnet with field rotation along array contours: middle pair of arrays about magnet mid plane.
Figure 14C:
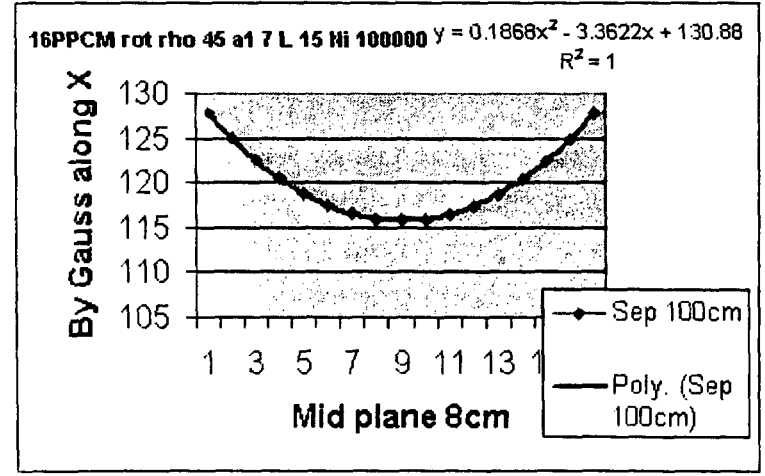
FIG. 14C shows a profile of the transverse MRI field along the co-axial axis of a six array magnet with field rotation along array contours: outer pair of arrays about magnet mid plane.

FIGS. 14A, 14B and 14C show the transverse field (in the Y direction FIG. 12) as a function of distance on and along the co-axial axis of the associated arrays in FIG. 13 for each associated pair. Separation distances between the plane of each pair of circular arrays are, respectively 16, 46, 100 cm.

These initial separation distances were primed from separation typical of MRI magnet designs using solenoid field coils.

Cancellation of the polynomial coefficients for transverse field using average module current in the array pairs as the optimisation variable, give a degree of uniformity in the co-axial direction on axis for the following values.

| Array pair separation distance | Average module Ampere-turns |
|---|---|
| 16 cm | 184360 |
| 46 cm | −236700 |
| 100 cm | 999140 |

These initial current optimised values are uneconomic. Using auto-optimisation to seek more economic set of module average currents provides an improved performance for the following associated array dimensions.

| Array pair separation distance | Average module Ampere-turns |
|---|---|
| 16 cm | 108840 |
| 40 cm | 21100 |
| 100 cm | 429150 |
| 16 cm | 13150 |
| 36 cm | 212710 |
| 100 cm | 93200 |

Figure 15:
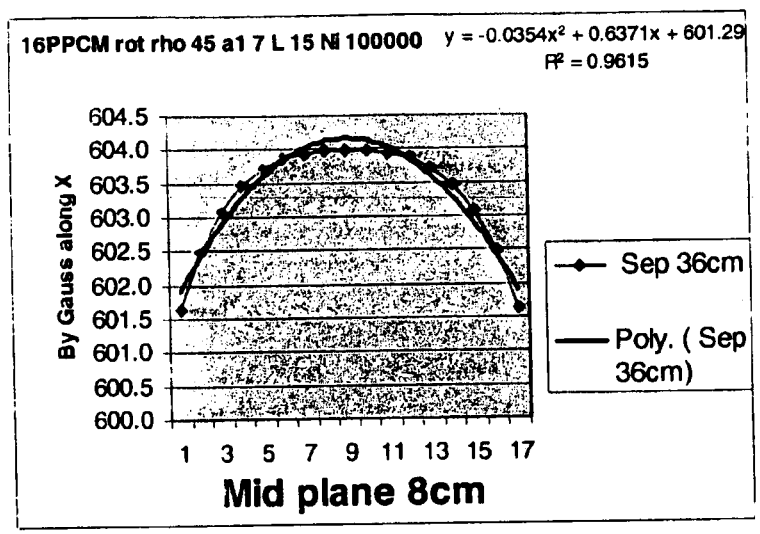
FIG. 15 shows a profile of the transverse MRI field along the co-axial axis of a six array magnet with field rotation along array contours after optimisation of Ampere-turns in array pairs.

The transverse field profile for the magnet on and along the co-axial axis due to the x6 associated arrays of rotated field PCM modules, using the dimensions above, namely separations of 16, 36, 100 cm, is shown in FIG. 15. Specifically, a profile of the transverse MRI field along the co-axial axis of a six array magnet with field rotation along array contours after optimisation of Ampere-turns in array pairs using a separation distance for the middle pair of 36 cm, compared to the profile used in FIG. 14B of 46 cm for the middle pair. The field uniformity of +/−500 ppm is achieved for ~10 cm The precision of the optimisation using x6 associated arrays can be improved by noting that from symmetry, the polynomial fit can be made to the transverse field profile on one side of the magnet only, and even order terms only are fed to the optimisation.

Figure 16A:
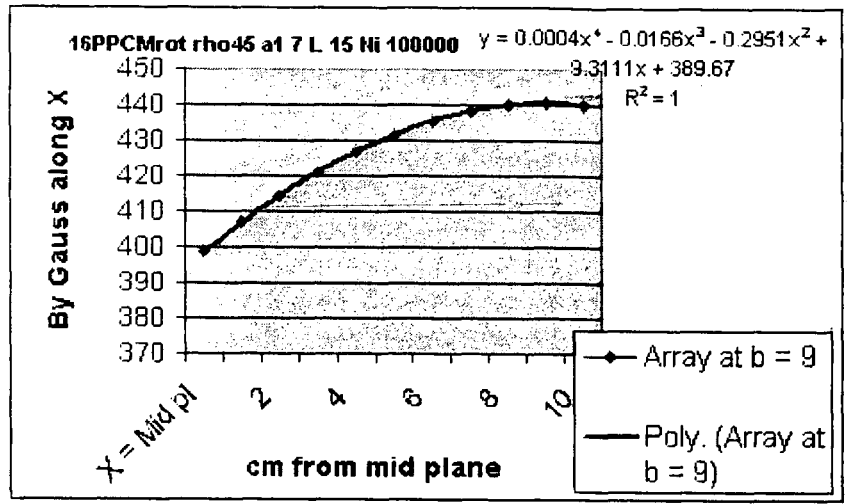
FIG. 16A shows a profile of the transverse MRI field along the co-axial axis of a six array magnet with field rotation along array contours: to improve optimisation accuracy inner array about magnet mid plane.
Figure 16B:
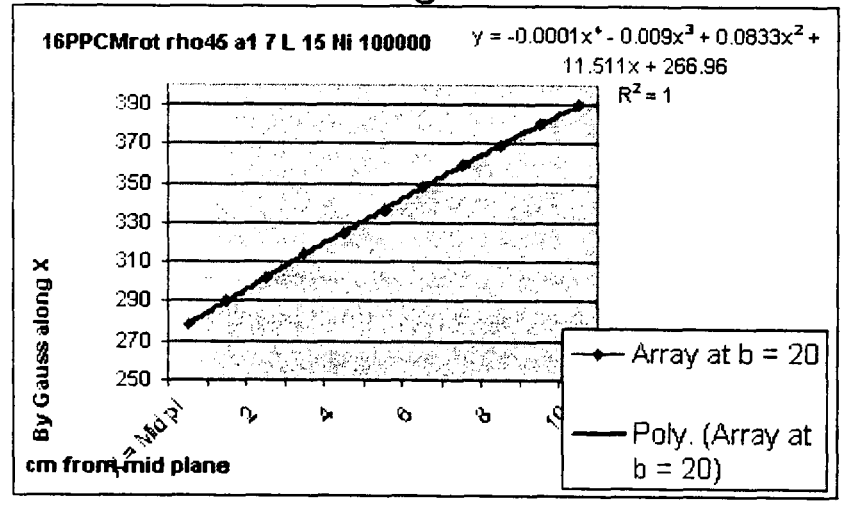
FIG. 16B shows a profile of the transverse MRI field along the co-axial axis of a six array magnet with field rotation along array contours: to improve optimisation accuracy middle array about magnet mid plane.
Figure 16C:
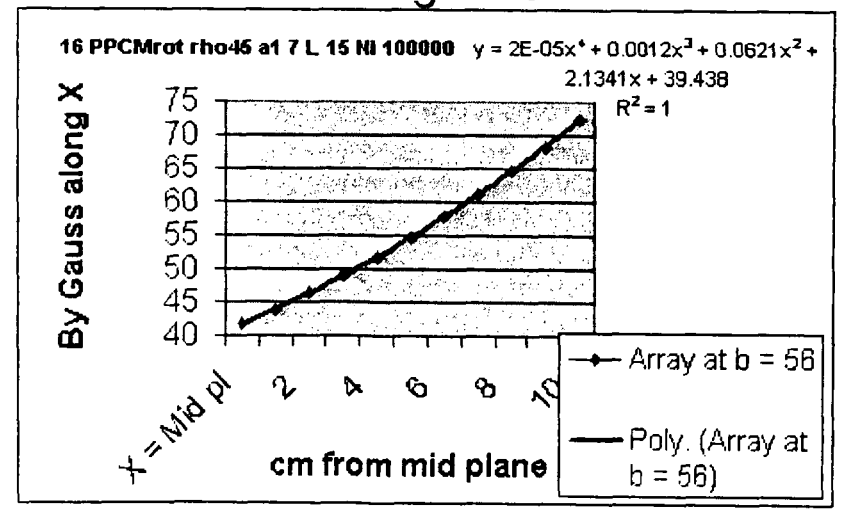
FIG. 16C shows a profile of the transverse MRI field along the co-axial axis of a six array magnet with field rotation along array contours: to improve optimisation accuracy outer array about magnet mid plane.

On this basis, FIGS. 16A, 16B and 16C show the transverse field as a function of distance on and along the co-axial axis of the associated arrays in FIG. 13 for each associated pair for one half of the magnet.

Auto-optimisation now produces the following:

| Array pair separation distance | Average module Ampere-turns |
|---|---|
| 18 cm | 53090 |
| 40 cm | 207240 |
| 112 cm | −25690 |
| 18 cm | 89410 |
| 48 cm | 179430 |
| 112 cm | 6190 |

Figure 17:
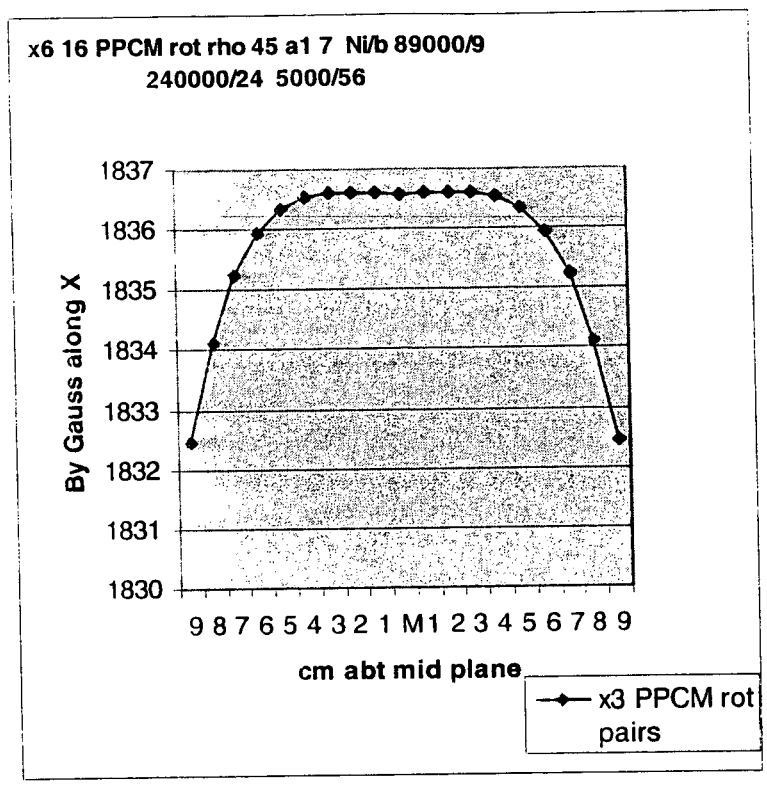
FIG. 17 shows a profile of the transverse MRI field along the co-axial axis of a six array magnet with field rotation along array contours after optimisation of Ampere-turns in the arrays in one half of the magnet using expanded set of even order sensitivity terms.

The transverse field profile for the magnet is now improved on and along the co-axial axis due to the x6 associated arrays of rotated field PCM modules. Where, using the dimensions above, namely separations of 18, 48, 112 cm, the uniformity is shown in FIG. 17 at +/−50 ppm achieved for ~12 cm co-axial length.

The use of HTS conducting surfaces in modular form allows for the construction of associated arrays which created uniform MRI fields in a target region centred on the common origin of the array set. The sensitivity of the dimensions of the arrays has been demonstrated for 6×16 identical PCM modules. Further optimisation is possible using multi parameter inputs. In this demonstration the PCM modules are used for fine adjustment of the average current distribution in order to improve field uniformity. The next section demonstrates direct adaptation of PCMM principal direction of magnetisation in order to produce a more valuable and unique form of MRI magnet.

Observation of the change in sign of the Optimisation Ampere-turns of the outer most pair of associated arrays in response to moving the middle pair of associated arrays from a separation inter-distance of 40 cm to 46 cm suggests that a separation distance of the middle pair exists at which the outer pair could be dispensed with. This shows an advantage to MRI magnet structures of a short patient access length using a transverse field enabled by PCM modules.

Figure 18:
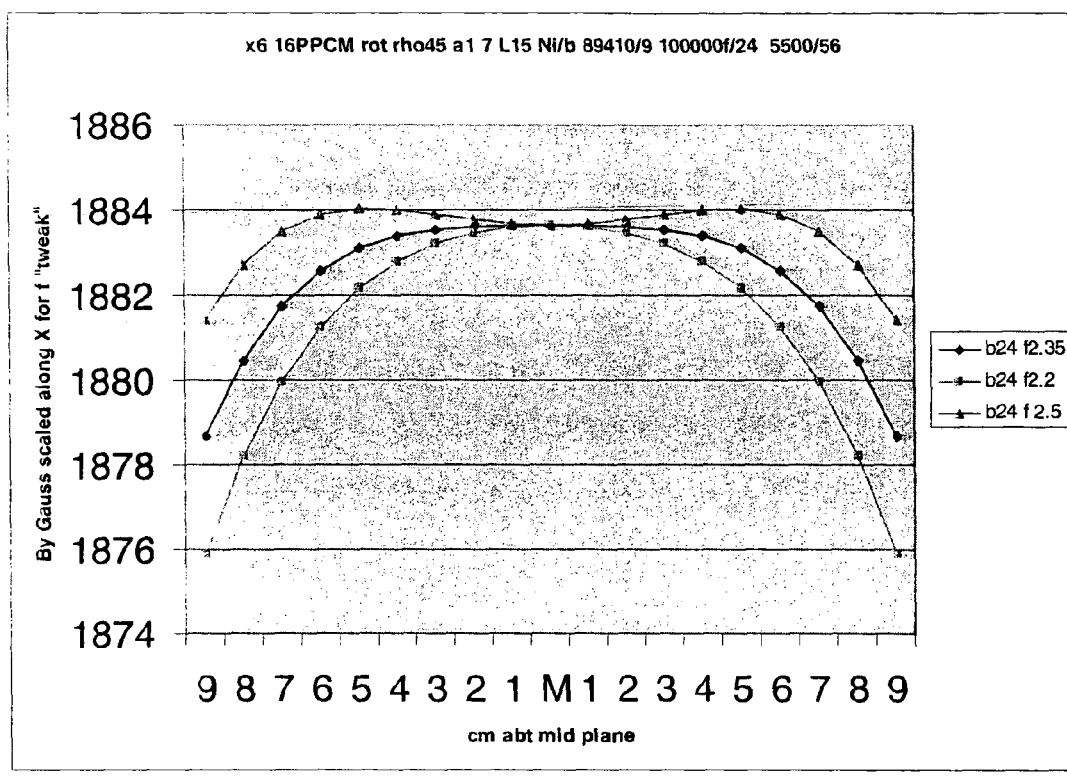
FIG. 18 shows a profile of the transverse MRI field along the co-axial axis of a six array magnet with field rotation along array contours after optimisation of Ampere-turns in the array pairs to fine focus the MRI field profile.

Item 11: The optimisation output is shown in FIG. 18
Description of Second Demonstration Output One of the advantages of enabling Cryo-resistive magnet operation, using intermediate cryogenic temperature refrigeration with PCM modules comprising HTS conducting paths, is the ability to continually adjust the MRI field profile in the target region. This permits the magnet to operate adaptively, refer to section 4.6. This demonstration relies on the calculation methods and dimensions of arrays forming a rotated field MRI magnet described in FIGS. 14 to 17, item 10 above.

The ability to focus the MRI field profile in the target region is shown in FIG. 18, for the transverse field profile for the magnet on and along the co-axial axis due to the x6 associated arrays of rotated field PCM modules. The field focussing is achieved by adjusting the average current in the modules of the middle associated array pair by ~6%

| Array pair separation distance | Average module Ampere-turns | | |
|---|---|---|---|
| | "Flat" | "point focus" | "valley focus" |
| 18 cm | 89410 | 89410 | 89410 |
| 48 cm | 235000 | 220000 | 250000 |
| 112 cm | 5500 | 5500 | 5500 |

Circular Array x1 with Field Rotation Along the Contours of the Arrays—Race Track Flat Spiral Continuous Current Path Comprise Primary Field Sources of PCM Modules Item 1: Dimensions of one circular array comprised of 16 "race track" PCMM are given in FIG. 19, along with the dimensions of the current paths used in field calculations. The geometry of the PCM modules is that shown in FIGS. 5A, 5B and 5C. The location of each PCM module around the contour of the single array and the rotation of the principal direction of magnetic field is that given in FIG. 19 and FIG. 31

This section demonstrates the use of the secondary field source to adapt the field of the primary field source specifically to achieve MRI field uniformity while minimising the volume of conductor used in the primary field source.

Each PCM module comprises a primary field source with a continuous current path in the form of a race track flat spiral, with two cylindrical continuous coated surfaces supporting defined helical current paths as the secondary field source, FIGS. 5A and 5B.

Item 2: The nominal principal direction of magnetic field rotates along the array contour, by x2φ, where φ is the angle subtended by the magnetic origin of each PCMM at the centre of the array. See for example, FIGS. 5C, 12A, 12B and 12C.

Item 3: There is one circular array comprising the MRI magnet, arranged such that the straight sides of the race track PCMM are in the direction of the axis of rotational symmetry of the array contour, and the array has 16 PCMM, shown in diagrammatic form in FIG. 5C. Within the boundary defined by the continuous current "race track" path of the primary source are set two cylindrical coated surfaces with defined helical paths, FIG. 5B. The cylinders are separated symmetrically a distance along the longest axis of the defined race track, in this example this separation is an optimisation variable. The coated cylinders are otherwise located at the same co-ordinates along the x16 PCMM circular array contour, FIGS. 6A and 19.

Item 4: The direction of the MRI field lies in the plane of the circular arrays, being normal to the co-axial direction of the arrays; FIG. 12B. In the context of MRI magnets, the MRI field direction is transverse to the direction of patient axis in both this example and that in FIG. 5C.

Item 5: The optimisation target is to achieve a uniform field in the transverse direction along a given length of the symmetric axis of rotation of the circular array, centred on the mid plane of the circular array, which also passes through the mid point of the long axis of the race track primary field sources arrays.

Item 6: The optimisation variable is the average current in the secondary field creating source, which is the same value for each of the two sets of coated cylinders comprising the secondary field source. This current is varied independently of the current in the primary, "race track" source of each module. The primary field sources of the array have the same value of average current outside optimisation.

Item 7: The demonstration comprises the calculation of the transverse field created by the primary field source in the plane of the circular array, as a function of length from the mid plane of the array, along the axis of rotation symmetry of the array. In this example the finite element method above is used to derive the sum of the fields projected by the primary field sources of the array. Similarly, the transverse field created by the secondary field sources is calculated for a series of values for the separation distance between the coated cylinders, FIG. 5B, along the long axis of the race track boundary. For each separation value, optimisation delivers a value of average current in the secondary field sources required to create a uniform field along the array axis of symmetric rotation. The separation distance that yields the lowest average current value is taken as the best optimisation in this set of variables. The optimisation is achieved using a computer algorithm to cancel the coefficients of polynomial fits of the field/axial length profile calculated for the primary and secondary field sources.

Figure 21:
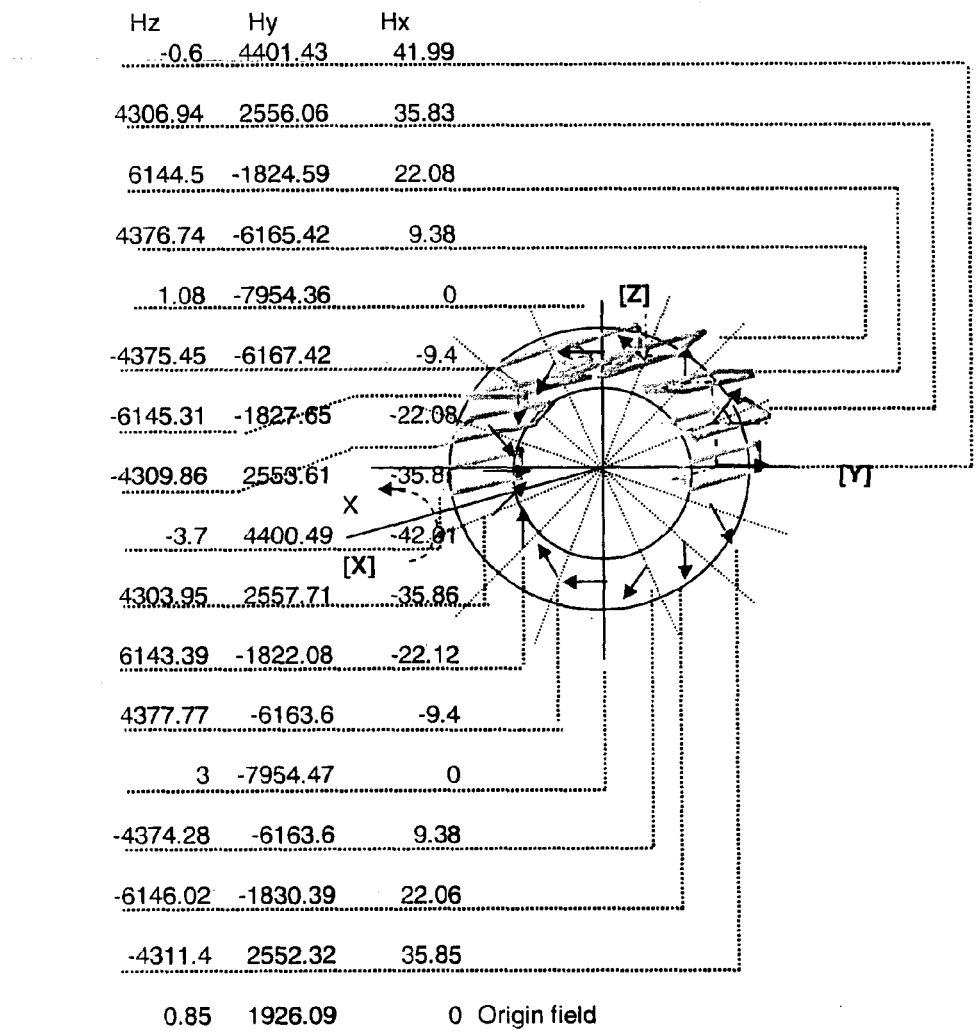
FIG. 21 shows the Vector field values at the magnetic origin of each "race track" module of one circular array contour.

Item 8: The finite element method is used to calculate the vector field values at the origin of each race track module of the x16 circular array. This is done in order to assess how closely the arbitrary selection of 16 modules for the array, made initially on geometric grounds, approaches an optimum distribution of modules along the array contour. More modules each occupying less length of the array contour provides improved control of field rotation. The values of the vector field at the magnetic origin of modules along the array contour are shown in FIG. 21. The field effects due to the secondary field creating source are not included.

Figure 20:
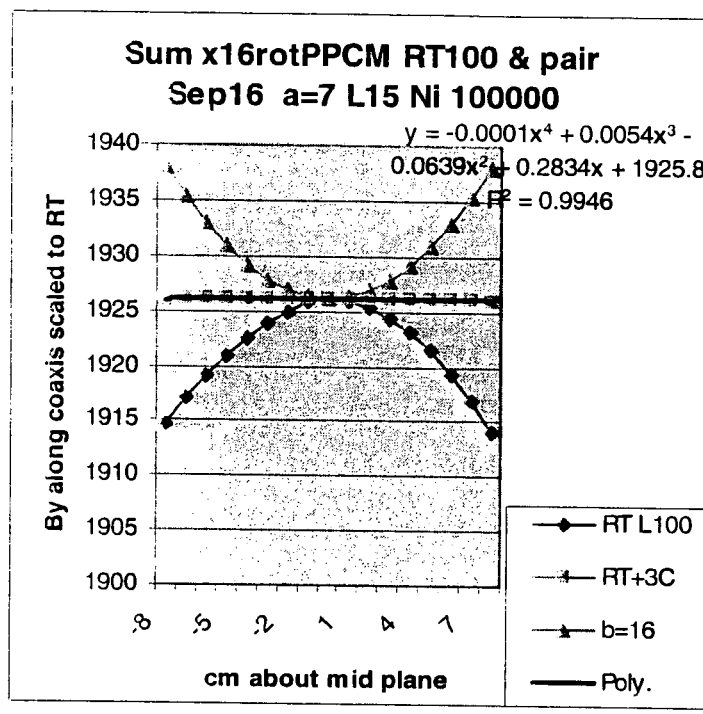
FIG. 20 shows a profile of the transverse MRI field along the along the axis of rotational symmetry of a single circular array, comprised of a race track conducting surface primary field source, and two cylindrical secondary field sources on the long axis of the module: This figure shows optimised current field profiles for array and for primary and secondary sources.

Item 9: The optimisation output is shown in FIG. 20: Description of the Demonstration Output FIG. 20 shows the transverse field (in the Y direction FIG. 12) as a function of distance on and along the axis of rotational symmetry of the circular array of field rotating PCMM (in the X direction FIG. 12). The transverse field due to the primary field source (race track continuous current path) is given by curve RT L100, the transverse field due to the secondary field source (two cylindrical surfaces with defined helix current paths 16 cm apart on the long axis of the primary source) is given by the curve b=16, where the curve RT+3C combines these two curves, showing the transverse field through the MRI region. The best available optimised value for Ampere-turns in the secondary field sources is found to be at a separation distance of 16 cm between the secondary field sources, as defined in item 3, and FIG. 5B, and also given the other array dimension values are fixed as given in FIG. 19. NOTE In FIG. 20 for convenience of display, the actual values of the transverse field contribution of secondary field sources is obtained by applying a scale factor of −0.1055 to the curve "b=16", so the secondary field source adapts the primary field source ~1926 Gauss with an opposing transverse MRI field on axis ~−203 Gauss.

It can be seen that a transverse field uniformity of approximately +/−250 ppm is achieved in the demonstration along some 16 cm of array axis of rotational symmetry, where, essentially, the secondary cylindrical field sources act to adapt the field of the primary field sources by correcting the end field effects of the race track continuous defined path of the primary field source. Further improvements within the module boundaries of this demonstration are possible if the number of secondary field sources is increased. It is important to note that the secondary field sources of each race track primary field source in each module provide the optimised MRI field uniformity for current energising the secondary sources in the opposing sense to that energising the primary field source.

FIG. 21 shows the vector field values at the origin of each race track module of one circular array contour arising from the combined module fields. All Hx are ideally equal to zero. Non-zero values are a calculation error associated with finite element meshing. It can be seen that the principal direction of magnetic field along the array contour does not rotate exactly as x2φ, the angle φ being that subtended by the origin of the modules. The departure from ideal field rotation is greatest in the quadrants of the contour, mid way between Y and Z axis. Departure from the x2φ rotation will introduce a variation in the transverse field values on the azimuth of the MRI region, increasing with the value of radius. Overcoming this effect with adjustment of module packing patterns and density has been discussed in UK 0903942.1 (set out in Appendix 1). By using a primary substantial field creating source and secondary lesser field source in each Programmable Cold Magnet module, an additional degree of freedom is introduced for the control of the variation of transverse field variation in the azimuth of the MRI target region. However, calculation of improved module/array dimensions requires detailed development of optimisation algorithms; see for example the mathematical methods already described above In FIG. 22 the scale of efficiency in terms of HTS material content of the rotated arrays is illustrated by reviewing the length of the conducting paths used in the demonstration examples, including both primary and secondary field creating sources of the modules. The path lengths are compared at a current capacity of 200 Amperes in field and operating in the temperature range 65-77° K. This being a typical current for a HTS conducting layer section 500 nano-meters thick and ½ cm wide. The module "batch" lengths of HTS conducting paths, and the total conducting path length for the MRI magnet examples are given in FIG. 22, enabled by discrete Programmable Cold Magnet modules. Also given are the lengths of LTS conductor needed for a typical whole body MRI magnet of solenoid field profile. It is important to note that for conveniently produced lengths of HTS conductor path, circa 200 m, it is possible to construct HTS MRI modular magnets relying on field rotation along the PCMM array contour. Such HTS magnets have similar performance and conductor requirements to that of LTS MRI magnets, but with the operational benefits of a simple cryogenic system. Modular LTS Niobium Tin magnets are also possible using PCM module forms of dimensions that allow for Niobium Tin filamentary composite reaction at elevated temperature, and deploying a current supply network utilizing superconducting composites and joint technology.

The uniformity of the MRI field in example demonstration in previous sections is similar to that taken as standard for medical MRI magnets, where in this invention PCM modules in circular arrays are used, with rotate of the direction of magnetic field along the contour of the array. In this application, the HTS modular magnet demonstrations yield fields of uniformity suitable for MRI over a target region diameter about ½ of that taken as standard for current LTS based MRI. However, further optimisation degrees of freedom exist in the modular magnet case not yet explored. It is asserted on the basis of the example demonstration given here that HTS magnets equal to MRI industry field standards are enabled by the use of HTS modules with adaptive field capabilities, which offer improved functional and economic capabilities. The modules comprising of a primary substantial field source provides a coarse projected field profile, adapted in use by a secondary lesser field source, to produce a refined degree of control of the projected fields of modules when in combination in the MRI target region. This invention achieves a link between what is practicable and economic in the production of HTS materials in thin film layers, and enabling what are desirable in extension of the use and availability of MRI.

Modular HTS magnets, using field rotation along the contour of associated arrays, contain within the physical boundary of the arrays enclosing the MRI target region a significantly higher proportion of the field energy than do solenoid LTS wound magnets of similar enclosing dimensions. This leads to improved NMR signal to noise per unit magnet mass, and to a small fringe field "foot print". Given the operating arrangement of cryo-resistive magnet power networks, HTS modular magnets present a wide range of improved design features relevant to deployment of MRI in medical and industrial image based analysis. In particular, higher field intensity to mass ratios are possible than was hitherto the case, such that MRI systems can in future be used in confined locations, above building ground floors, under field dynamic experimental situations, and easily relocated in use.

Circular Co-Axial Arrays x2 with PCMM Field Direction Broadly Parallel with MRI Field Direction—"Solenoid Field": Flat Spiral Continuous Support Surface Comprise Primary Field Sources of PCM Modules.

Set Up and Demonstration Considerations

Item 1: The examples in this section concern the simulation of solenoid field profiles in the MRI target region using the PCMM described in this invention. Although solenoid field profile simulation are not as efficiently achieved with HTS modules, as with LTS windings, the simulation of solenoid fields using the secondary field source of modules as a significant control function provides for large diameter MRI target regions, relative to the dimensions of the enclosing arrays. Solenoid profile MRI fields can also be obtained in compact magnet dimensions using modular HTS arrays with useful MRI field volumes, such that the small magnet dimensions and high MRI field intensities, delivered from simple cryogenic arrangements, are valuable deployment features. Compact HTS magnets are expected to be relevant to applications such as mobile military operating theatres or pipe line non invasive flow meters.

Dimensions are given in FIG. 23 of two examples of circular arrays comprised of PCMM organised to provide solenoid MRI field profiles relative to the PCMM array contours. The primary field creating source of the PCMM is in each case a flat circular spiral continuous current path that provides a coarse solenoid projected field profile from a set of PCMM arranged along a circular array contour. In each case the principal direction of magnetic field of all the modules is the same along each array. More than one array is used in association to project a uniform field in the MRI region, where the principal direction of the field of each module in each array is generally in the direction of the MRI field.

Item 2: The finite element method is used to calculate the MRI field along the co-axial axis of the x2 circular array magnet. The dimensions of the arrays, and the modules, are given in FIGS. 23A and 23B. The initial choice of dimensions is based on approximating the geometry and scale of typical split pair wound coils, organised to produce solenoid field profiles, such as that of the well known Helmholtz pair of coils. In this application what is demonstrated for solenoid MRI field profiles, is the benefit of the secondary lesser field creating source of each PCM module as a means to adapt the relative coarse projected field of the primary substantial field creating source.

Item 3: The optimisation target in this section is the current distribution in the secondary lesser field creating source, required to produce a uniform field in the MRI target region. Some iterative adjustment is made of the dimensions of the closed cylindrical coated surfaces seeking the minimum number of Ampere-turns in the secondary field source for each dimension set used. The optimisation method employed is that described above, although some collateral calculations are made using analytical expressions of the MRI field on the co-axial axis of the magnet for a set of equivalent loop currents parallel to the array contour, as described in UK0903942.1 as set out in Appendix 1. In this simplification, a closed solution exists enabling the sensitivity of current distribution to dimensions of the secondary field source to be represented as an expansion of the analytical expression used for MRI field as a set of even order derivatives of field/direction. This allows for "input steering" towards "best" dimensions of the secondary field source in the exercise to optimise the current distribution calculated by the method used for PCMM calculations described above.

PCM module array magnets arranged to produce solenoid fields, in which the principal direction of the magnetic field of the modules is the same for all modules along each array contour, and lies generally in the same direction as the MRI field, show a variation in MRI field intensity along the azimuth of the MRI region on the mid plane. This effect is discussed in UK0903942.1 (as set out in Appendix 1), where control of the effect is achieved by combining different types of modules in each array and adjusting stacking patterns. The use of secondary field sources in each module for "fine tuning" of modules relative to their array neighbours increases the volume and quality of the MRI field.

Item 4: Example (i) of PCMM for Solenoid MRI Field Profile—Module Field Close to Parallel with MRI Field Principal Direction of Magnetic Field of Modules Close to the MRI Field Direction:

Primary field creating source of each module being two co-axial flat spiral continuous support surfaces for current path and secondary field creating source of each module being a closed cylindrical support surface with a defined helical current path FIG. 7A shows the module lay-out, FIG. 7B shows the x2 array magnet lay-out. The number of modules per circular array is 13.

Figure 24:
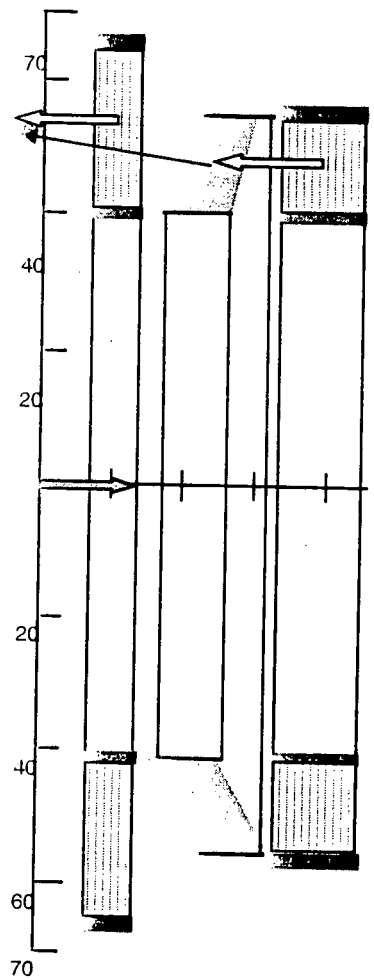
FIG. 24 shows a section view of one ½ of MRI magnet (solenoid field) comprised of two circular arrays with PCMM using two co-axial primary field sources and one secondary tilted cylindrical field source.

FIG. 24 shows a section through one half of the magnet about the co-axial axis of the arrays, illustrating the relationship of the module current paths to the course of the array contour and the direction of field created.

Figure 25:
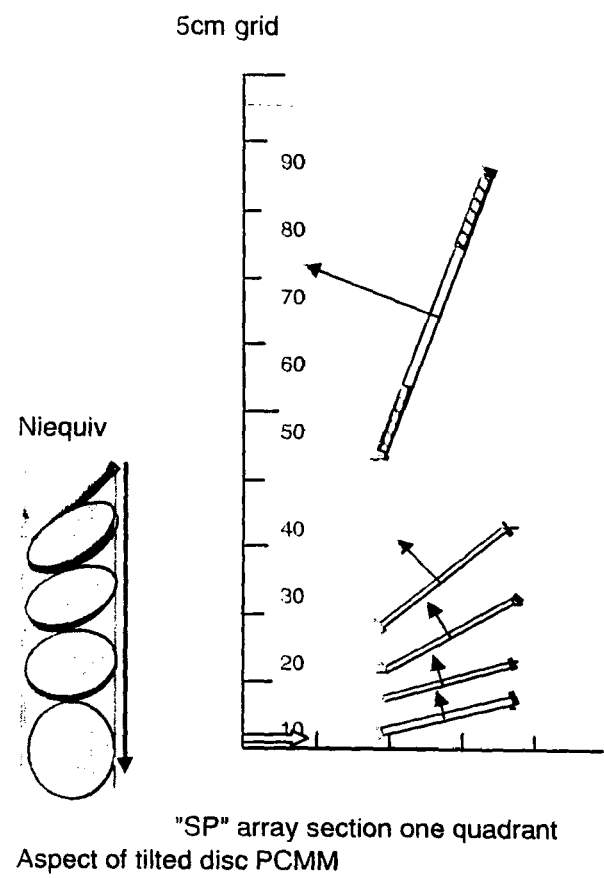
FIG. 25 shows a section view of one ¼ of MRI magnet (solenoid field) comprised of two circular arrays with PCMM using one disc path, tilted primary field source and four secondary tilted cylindrical field sources of deep radial build.

Item 5: Example (ii) of PCMM for Solenoid MRI Field Profile—Using Tilted Primary and Secondary Field Sources Principal Direction of Magnetic Field of Modules Generally in the MRI Field Direction:

Primary field creating source of each module being one flat spiral continuous support surface for current path, tilted by an angle of maximum 45° away from the array axis of rotational symmetry; Secondary field creating source of each module being four closed cylindrical support surface with a defined helical current paths, tilted by an angle of maximum 80° away from the array axis of rotational symmetry, and with their magnetic origins on different radial values; FIG. 8A shows the module lay-out, FIG. 8B shows the x2 array magnet lay-out; Number of modules per circular array 9; and FIG. 25 shows a section through one quarter of the magnet about the co-axial axis of the arrays, illustrating the relationship of the module current paths to the course of the array contour and the direction of field created.

Figure 26A:
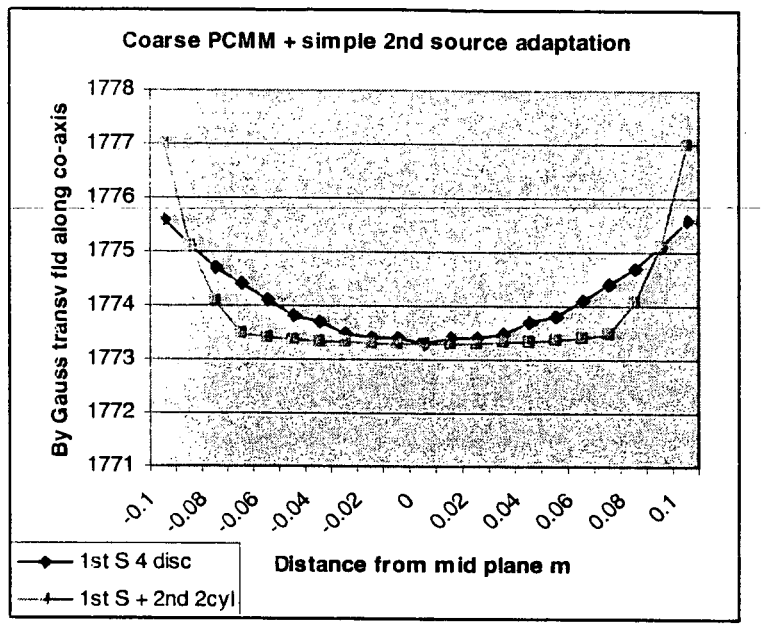
FIG. 26A shows a profile of the solenoid MRI field along the co-axial axis of the two circular arrays: Per PCMM two co-axial primary field sources and one secondary tilted cylindrical field source.
Figure 26B:
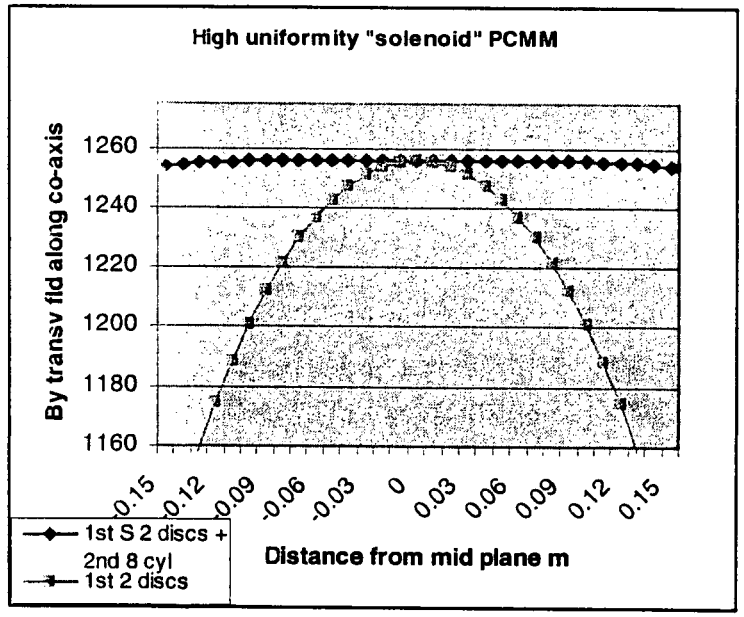
FIG. 26B shows a profile of the solenoid MRI field along the co-axial axis of the two circular arrays: Per PCMM one disc path, tilted primary field source and four tilted secondary cylindrical field sources concentric about the magnet axis of rotational symmetry.

Item 6: The Optimisation Output is Shown in FIGS. 23, 26a and 26b

Description of the Demonstration Output

Example (i) is a simulation using HTS PCM modules of a typical layout of circular co-axial field sources as found in LTS wound conductor magnets, where subject access is along the direction of the co-axial axis. The current paths of modules are indicated in magnet array form in FIG. 24 employing a section view through ½ of the magnet. The arrows show the principal direction of the magnetic field at their respective locations. The current distribution derived from optimisation within the envelope of tested dimensions is given in FIG. 23A. This particular arrangement of modules, as shown in FIG. 7A, is in itself a compact and simple current path layout which involves two flat spiral continuous support surfaces comprising the primary substantial field source. The spiral paths are separated axially to allow for a single coated cylindrical surface, which supports a helical defined current path. The helical pitch provides a small tilt of the principal direction of magnetic field of the secondary source relative to the MRI field direction.

There is adaptation of the primary substantial field in this arrangement, using a minimum construction feature of one cylindrical coated surface for the secondary field source. From FIGS. 23A and 26A, it can be seen that the secondary lesser field source requires some 9% of the Ampere-turns of a PCM module in order to achieve adaptation of the primary field source, such that the combined fields of the modules provides a uniform MRI field in the target volume. In FIG. 26A is shown the MRI field on the co-axial axis of the magnet for ±15 cm about the magnet mid plane, for the primary field source alone and for the optimised uniformity, which is approximately +/−250 ppm field deviation from the central value.

A larger volume of uniform field can be obtained with more complex combinations of primary and secondary field sources, as shown in example (ii) below, but this example using flat spiral continuous conductor support paths set with their axis of rotational symmetry parallel to the direction of the MRI field is particularly economic to assemble.

Example (ii) is a simulation using HTS PCM modules of a typical layout of co-axial field sources as found in a split pair LTS wound conductor magnet, where-in the various circular field sources are generally arrayed in concentric fashion so that the total array has the features of two opposing pole pieces. Subject access is to the mid plane between the pole pieces along any direction normal to the co-axial axis. This approach demands more complex PCM module structures employing significant radial distribution of current paths. However, as shown below, larger volumes of MRI field can be achieved in a given space envelope using a series of short defined current path elements in the secondary field source of each module.

FIG. 8A shows an example of a radial build PCM module using tilted primary and secondary field sources, whereby the degree of tilt increases as the radial origin of the element paths of the secondary sources is reduced. The PCM modules in x2 arrays present the aspect of a two pole magnet, FIG. 8B. To illustrate the arrangement of current paths and the field directions of the modules, FIG. 25 gives a section view through one quadrant of the magnet. It should be noted that the primary field source is formed as a disc, based of a flat spiral continuous conducting path, where-in the width of the conducting path on the support surface is much less than the diameter of the disc. Similar disc geometry is applied to the basic cylindrical support surfaces of the secondary field sources.

The current distribution derived from optimisation within the envelope of tested dimensions is given in FIG. 23B, with the field uniformity achieved shown in FIG. 26B, for the primary field source by itself, and for the primary field source plus adaptive correction of the projected field derived by the current distribution in the secondary field source. It can be seen from the two figures that a field uniformity of some +/−40 ppm of the central field is achieved along +/−12 cm of the magnet co-axial axis about the mid plane for a total Ampere-turns in the secondary field source of approximately 5% of the Ampere-turns of the primary field source. Thus, adaptation of the uniformity of the MRI field on axis is efficiently achieved using greater subdivision of the current distribution of the secondary field source, compared to example (i) of solenoid modular arrays. It is however the case that the construction of the PCM modules is more complex, involving a significant radial build and tilt of the current elements about their magnetic origin.

It is important to note that for conveniently produced lengths of HTS conductor path, circa 200 m, it is possible to construct HTS MRI modular magnets replicating LTS magnets producing solenoid MRI fields. The concept of a secondary, lesser field source involved with each PCM module to adapt the field of the primary field source provides a degree of control of MRI field uniformity produced by relatively simple modular spiral continuous conductor paths. Such HTS magnets have similar performance and conductor requirements to that of LTS MRI magnets, but with the operational benefits of a simple cryogenic system.

It is important to note that the PCM modules comprising the two pole magnet, like all examples illustrated in this application document; relies of cryo-resistive operation; i.e.

there are low values of resistance in the current distribution network used to energise the primary and secondary field creating modules, section 4.6. The localised heat generated in the distribution network is simply removed by the nitrogen based refrigeration system.

The substantial efficiency of nitrogen refrigeration also makes it possible to deal economically with heat loads arising from structure supports of the PCM modules, where such supports take the forces arising electromagnetically in the field sources to the main frame of the magnet.

Given intermediate cryogenic temperature refrigeration can be arranged to deal with support heat loads, it is possible to consider equipping two pole HTS modular magnets with ferromagnetic pole pieces and flux return yokes between the two poles of the magnet. The former creates a higher field intensity for a given projected field intensity of the primary field source of the modules, while the latter reduces the fringe field of the magnet. Using well known design methods deploying ferromagnetic materials with a high permeability, such as Silicon Iron alloys, it is practicable to increase the MRI field to circa 10,000 Gauss for the HTS path length described in FIGS. 24A and 24B. In particular, the efficiency of the nitrogen refrigeration allows the PCM modules to be arrayed along a contour close to the field profiling iron, which may be operated at room temperature to avoid field errors due to the sensitivity of permeability to temperature adversely distorting the MRI field uniformity.

Open Access MRI Projection Magnet with Two Fold Associated Array Symmetry.

Set Up and Demonstration Considerations

Figure 28A:
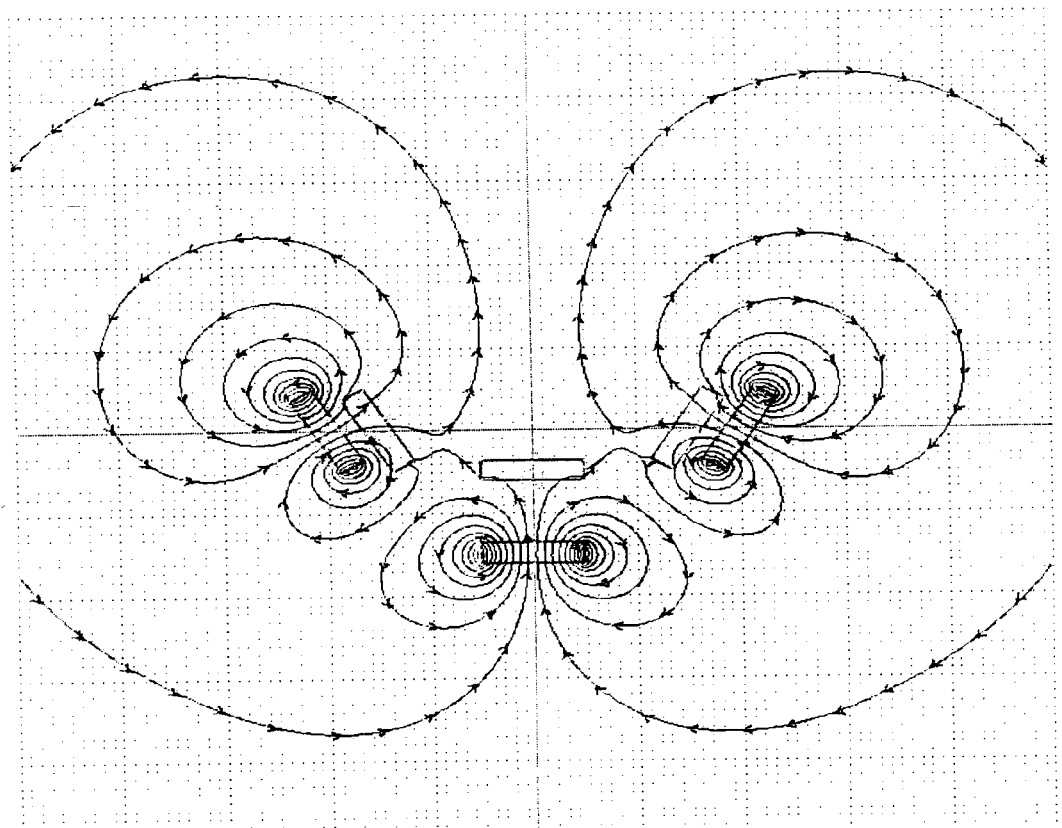
FIG. 28A illustrates diagrammatically the field profile from a two fold symmetry employing four associated arrays (in pairs) along the axis separation and rotation, and two associated arrays along the orthogonal axis of rotation.

Item 1: A layout of a set of associated arrays with two fold symmetry of axes of rotation is given in FIG. 27A. In this example, the concept of a fairly small MRI magnet system is illustrated, suitable for mounting on an inspection gantry, where-in the associated arrays are formed by close packing PCMM within generally cylindrical geometry to form three principal pole pieces. It should be noted that the associated array concept allows for a number of additional means of variation of the current distribution in the system. The demonstration described later considers a variation of Ampere turns along the axes of rotation A & B of FIG. 27A, so that the effective number of circular arrays in this example is doubled as shown in FIG. 28A. The optimisation target is the field vector Bz shown as black arrows for each axis of symmetry in FIG. 27A. The axes of symmetry A & B in FIG. 27A are referred to as the "separation axis of rotation" of co-axial associated arrays A, and the "orthogonal axis of rotation" of co-axial associated arrays B.

Figure 27B:
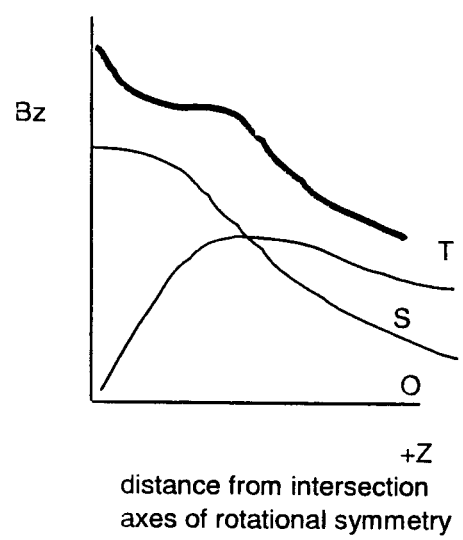
FIG. 27B shows the form of Bz field profile in the +Z direction along Z for opposed separated arrays S, Orthogonal arrays O, and their sum T.

Item 2: The general form of the field profile of vector Bz from a system of associated arrays is shown in FIG. 27B in the form of Bz field profile in the +Z direction along Z on the separation mid plane for opposed separated arrays S, with Orthogonal arrays O.

The polarity of the associated arrays is opposed across the mid plane of "separation axis of rotation". As explained in general in the section on Maths methods for optimisation, there are complex choices to be made as to the variables used in optimisation of a two fold axes of symmetry described in this example. The obvious choices which can be conveniently reduced to practice are; i Distribution of defined current paths along each of the axes of rotational symmetry, achieved by creating circular arrays of PCMM about the axis, each with a given number of Ampere turns in the PCMM of the arrays, see FIGS. 7A, 7B & 24; ii Distribution of defined current paths in a radial directions from each of the axes of rotational symmetry, achieved by creating concentric circular array contours for PCMM coplanar with each other; iii Tilting the Opposing poles formed by associated arrays along their axis of rotational symmetry, by an angle relative to and about that axis, see FIG. 28A; Adjusting the separation of Opposed poles on the "separation axis of rotation" in relation to the distance of the co-axial arrays along the "orthogonal axis of rotation". Note that there can be finite separations between associated arrays along axes of rotation and with respect to radius of concentric arrays, see FIGS. 25, 28A.

Item 3: FIG. 27A illustrates the typical location of the uniform MRI zone that systems of two fold symmetry can achieve, while FIG. 28A illustrates the approximate MRI region along the +Z axis by the existence of parallel field lines. In the example where-in the associated arrays have circular array contours, the MRI region will have a spherical geometry, located about the Z axis. Using four associated arrays in the optimisation in this example is a simple case, and the diameter of the MRI region is approximately 20% that of the average diameter of associated arrays, with the projection of the MRI region along the Z axis about x2 the average radius of associated arrays. The volume of the MRI region can be increased if the system is extended along the X axis, FIG. 27A such that the array contours have two parallel straight sides in the geometric form of a race track. In the case of race track extensions of arrays, there are further options for optimisation as represented in the discussion of rotations of the principal direction of the magnetic field of PCMM along an array contour, see FIGS. 5, 19, 20 and 21. End effects of the race track contour are of particular importance. However, the MRI region is extended linearly being typically 25% of the length of the straight side extension of the associated arrays along the X axis, FIG. 27A. A further point to note is that if the order of symmetry is increased beyond two fold by increasing the number of "orthogonal axis of rotation" intersecting the origin of the system, the degree of freedom for optimisation is increased, effectively by increasing the number of relatively "tilted" arrays. Multiple PCMM arrays in association forming horse shoe magnets may be treated in this way to project MRI regions beyond the physical boundaries of the magnet.

Item 4: The optimisation target is to achieve a uniform field in the radial projection direction, along the Z axis of the magnetic field vector Bz. This is undertaken by calculating the Bz field profile along the Z axis for two separated pairs of associated arrays on the "separation axis of rotation" and two co-axial arrays on the "orthogonal axis of rotation", in the latter case the orthogonal arrays are different distances from the origin of the magnet along −Z, FIG. 28A. Polynomial coefficients for these current distributions are derived, Bz=f (Z), and the coefficients above zero are cancelled by using ampere turns as a variable and a target value for zeroth coefficient of Bz, see section Maths of optimisation.

Description of Demonstration Output

FIG. 28B gives the dimensions of PCMM, of close packed arrays forming the associated field sources, and of the relative locations of associated arrays. The latter defines the space envelop of the MRI magnet. The layout of the associated arrays is indicated in FIG. 28A. The polynomial numerical fits of the Bz component along the +Z axis were calculated using the core elliptic integral algorithm described in the mathematical methods section for each array pair and each of the orthogonal arrays. To improve accuracy of optimisation, the numerical fits of Bz were made along Z through the initially estimated Z co-ordinates of the MRI region; i.e. about x2 the radius of the separated arrays, generally as indicated in FIG. 28B.

Figure 29A:
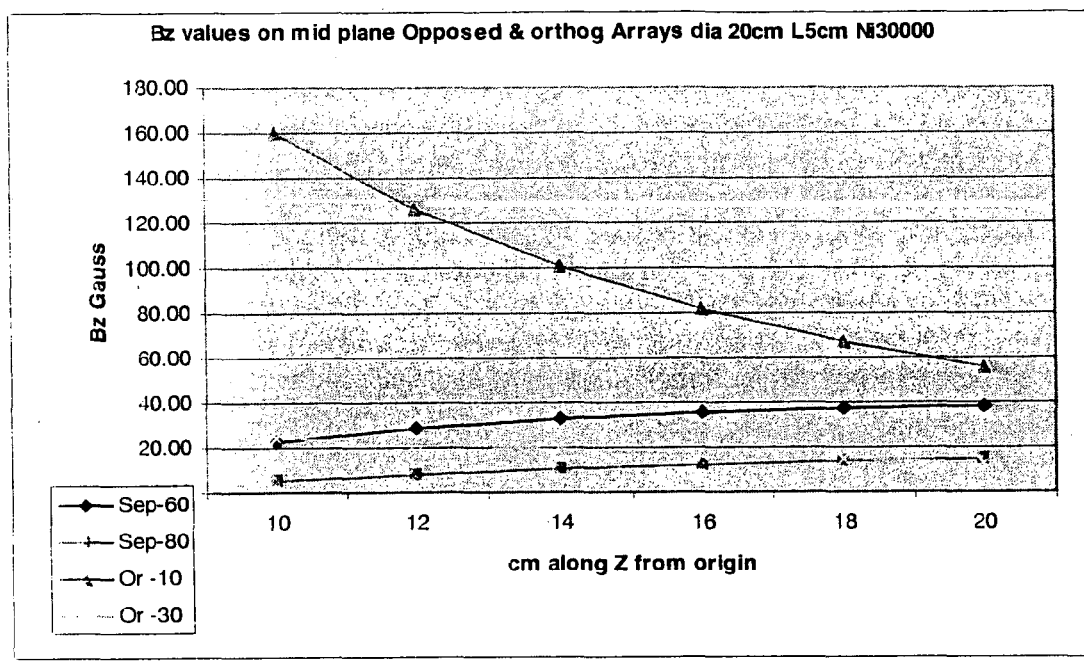
FIG. 29A shows the value of Bz along the +Z axis from the intersection on Z of the two axes of rotational symmetry for each array and array pair for the equivalent Ampere turns of 30,000.
Figure 29B:
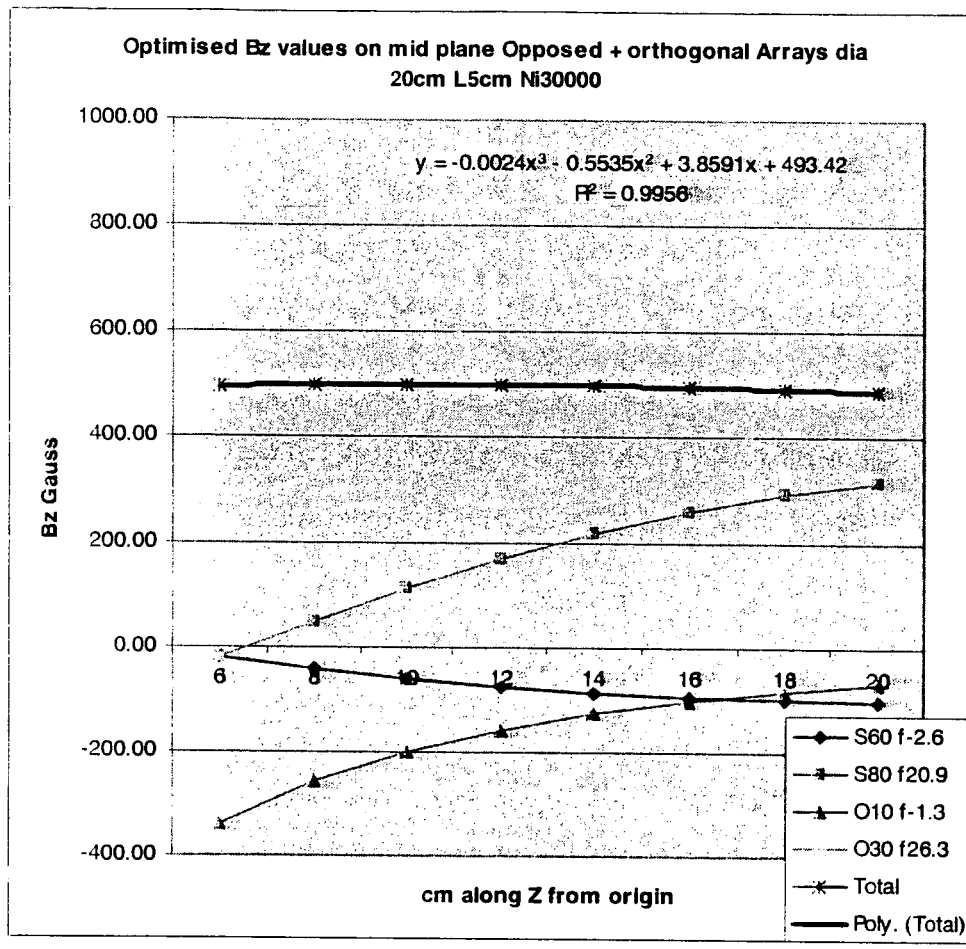
FIG. 29B shows the value of Bz along the +Z axis from the intersection on Z of the two axes of rotational symmetry for each array and array pair for the equivalent Ampere turns obtained after optimisation. The figure shows the optimisation Ampere turns multiplication factor for 30,000 Ni to get the total optimised Ampere turns of the magnet.

FIG. 29A shows the value of Bz along the +Z axis from the intersection on Z of the two axes of rotational symmetry for each array and array pair for the equivalent Ampere turns of 30,000. FIG. 29B shows the value of Bz along the +Z axis from the intersection on Z of the two axes of rotational symmetry for each array and array pair for the equivalent Ampere turns obtained after optimisation. Optimisation was undertaken to cancel polynomial coefficients up to forth order. Both odd and even coefficients require cancellation as the sources are distributed asymmetrically with respect to the +Z axis. A target Bz field of 500 Gauss was selected. Considering FIG. 29B, the resulting sum of Bz for the associated arrays has a polynomial showing a small residue in coefficient values indicating that a uniform MRI region suitable for MRI is possible between 6 and 20 cm from the intersection on Z of the two axes of rotational symmetry for each array and array pair. The approximately spherical volume of the MRI region could be increased by cancellation of high order coefficients, which involves increasing the number of associated arrays, and possibly using different optimisation variables for efficient use of HTS TF.

The optimised Ampere turns for this example are given in FIG. 28B. Note that there is some inefficiency in that a small negative operating number of Ampere turns are required for field uniformity in this model. Therefore, alternative optimisation choices could be profitably investigated. As remarked earlier, this example is of a small PCMM MRI magnet suitable for gantry mounting for variable location relative to a patient being locally scanned. The length of HTS TF defined current path of ½ cm width required is approximately 1300 m for 500 Gauss. As a crude comparison, very approximately using linear scaling, this amounts to some 39 Km defined current path for 1.5 T, the intermediate field level for conventional MRI, or 7.8E06 Ampere meters. This is a similar level of Am required for conventional LTS He based magnets. Although the volume of the projected zone is less than achieved with patient encompassing unitary solenoid coils, the economics in terms of length of defined current path are attractive given the open access of the PCMM system, particular since straight forward cryogenic enables flexible mounting arrangements for the magnet on a gantry resembling an XR monitor.

The invention claimed is:

1. A magnetic module for use as a module in a magnetic resonance system comprising a modular array arranged such that a combined field being of sufficient uniformity to enable a magnetic resonance procedure to be performed is created in a working volume comprising:
   a primary magnetic field source and a secondary magnetic field source each comprising a support structure upon which is defined a conducting surface path of superconductor material;
   wherein said primary and secondary sources are adapted such that the respective conducting surface paths are operable to be independently energized with electric current to provide a primary and a secondary magnetic field respectively;
   the primary and secondary magnetic field sources are arranged such that the primary magnetic field provided by the primary source can be adapted by adjusting the secondary magnetic field provided by independently energising the secondary source and wherein the primary and secondary magnetic field sources are arranged such that the secondary magnetic field source is operable to modify the absolute field strength of the primary magnetic field when independently energised with electric current; and
   wherein the support structure comprises an at least partially radially overlapping layer of the super conductor material arranged in a spiral wherein the conducting surface path of super conductor material is arranged on the surface of the support structure such that the conducting path has a first point for the introduction of current and a second point for the extraction of current.

2. A magnetic module according to claim 1 wherein the primary magnetic field source and/or the secondary magnetic field source comprises a magnetic field source.

3. A magnetic module according to claim 1 wherein the primary magnetic field source and/or the secondary magnetic field source comprises a curvilinear closed support surface and the corresponding conducting surface path of superconductor material comprises one or more continuous conducting surface defined paths arranged on the curvilinear surface.

4. A magnetic module according to claim 3 wherein the curvilinear closed support surface is a cylinder or a truncated cone.

5. A magnetic module according to claim 1 wherein said primary and secondary sources are arranged co-axially along the axis of radial symmetry.

6. A magnetic module according to claim 1 wherein said primary source is at least partially surrounded by said secondary source.

7. A magnetic module according to claim 1 wherein said primary magnetic source comprises at least one magnetic field source and said secondary magnetic source comprises a curvilinear closed support surface having one or more continuous conducting surface defined paths arranged on the curvilinear surface.

8. A magnetic module according to claim 1 wherein the primary and secondary magnetic field sources are arranged such that the primary magnetic field can be adapted by the secondary magnetic field to adjust the direction of the primary magnetic field.

9. A magnetic module according to claim 8 wherein the secondary magnetic field source is located such that its axis of radial symmetry is displaced radially relative to the axis of radial symmetry of the primary magnetic field source while having the same principal direction of magnetisation as the primary field source.

10. A magnetic module according to claim 9 wherein the secondary magnetic field source comprises two curvilinear support surfaces having a conducting surface path and the two curvilinear support surfaces are displaced symmetrically about the axis of radial symmetry of the primary magnetic field source and have the same principal direction of magnetisation as the primary field source.

11. A magnetic module according to claim 9 wherein the secondary magnetic field source comprises a curvilinear support surface and the primary magnetic field source comprises a plurality of magnetic field sources.

12. A magnetic module according to claim 8 wherein the secondary magnetic field source has a principal direction of magnetisation that intersects the principal direction of magnetisation of the primary magnetic field source.

13. A magnetic module according to claim 12 wherein the magnetic origins of the first and second magnetic field sources are separated either or both with respect to a vector component of their common radial directions relative to the vector component of their common axial directions of rotational symmetry or with respect to the vector component of their common axial direction of rotational symmetry.

14. A magnetic module according to claim 12 wherein said first magnetic field source comprises at least one magnetic field source and the secondary magnetic field source comprises a curvilinear closed support surface having one or more continuous conducting surface defined paths arranged on the curvilinear surface.

15. A magnetic module according to claim 12 wherein the secondary magnetic field source comprises a plurality of magnetic field sources displaced orthogonally from a common origin.

16. A magnetic module according to claim 1 wherein said superconductor material comprises a high temperature superconductor (HTS) thin film.

17. A magnetic module according to claim 1 wherein said superconductor film provides superconductivity above a temperature of 23° Kelvin.

18. A magnetic module according to claim 16 wherein said thin film is deposited on the surface of support structure by, for example, any or all of chemical vapour deposition, pulsed laser deposition or metal-organic deposition.

19. A magnetic module according to claim 1 wherein said superconducting material is an inter-metallic low temperature filamentary conductor comprising superconducting joints for connecting the first and second point to a current supply.

20. A magnetic module according to claim 1 wherein either or both of said first and second magnetic field sources may further comprise ferromagnetic material arranged to enhance the magnetic field of said sources.

21. A magnetic module according to claim 1 wherein the conducting surface path of either or both of said first and second magnetic field sources comprises a defined first and second point comprising termination pads deposited on the conducting surface path such that the first and second point are operable to be connected to a conventional conductor for supplying current.

22. A magnetic resonance system comprising a plurality of magnetic modules as set out in claim 1 arranged in an array such that the magnetic fields of the magnetic modules combine within a working volume to define a field having a magnetic field direction defining a main field axis and being of sufficient uniformity to enable a magnetic resonance procedure to be performed on a target object when placed within the working volume.

23. A magnetic resonance system according to claim 22 wherein the magnetic modules are arranged such that the magnetic moments of the modules form a curvilinear array.

24. A magnetic resonance system according to claim 22 wherein the magnetic modules are arranged in a Halbach array around the working volume.

25. A magnetic resonance system according to claim 22 wherein further comprising programmable power supply means comprising a plurality of power supply units and operable to be programmed with instructions to control current supply to the magnetic modules of the array; and
   a cryo-resistive network comprising resistive bus-bars operable to connect the programmable power supply means to the magnetic modules such that the primary and secondary field sources of the modules in the array are independently energised by electric current from the programmable power supply means.

26. A magnetic field source according to claim 1 wherein the support structure comprises a flat spiral such that the radius of the support structure increases as a function of angular distance subtended from an origin.

27. A magnetic field source according to claim 26 wherein the functional relationship between the radius and angular distance is such that the support structure defines a radially expanding circular loop.

28. A magnetic field source according to claim 27 wherein the functional relationship between the radius and the angular distance is such that the support structure defines a radially expanding race track having two straight sides of equal length and semi-circular end portions.

* * * * *